US009927658B2

(12) United States Patent
Kawamura et al.

(10) Patent No.: US 9,927,658 B2
(45) Date of Patent: Mar. 27, 2018

(54) ACTIVE MATRIX SUBSTRATE, LIQUID CRYSTAL PANEL, AND METHOD FOR MANUFACTURING ACTIVE MATRIX SUBSTRATE

(71) Applicant: Sharp Kabushiki Kaisha, Sakai, Osaka (JP)

(72) Inventors: Takehiko Kawamura, Sakai (JP); Tetsuya Tarui, Sakai (JP); Hidenobu Kimoto, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 15/501,877

(22) PCT Filed: Jun. 24, 2015

(86) PCT No.: PCT/JP2015/068176
§ 371 (c)(1),
(2) Date: Feb. 6, 2017

(87) PCT Pub. No.: WO2016/021318
PCT Pub. Date: Feb. 11, 2016

(65) Prior Publication Data
US 2017/0227799 A1 Aug. 10, 2017

(30) Foreign Application Priority Data
Aug. 7, 2014 (JP) .................................. 2014-161942

(51) Int. Cl.
*G02F 1/136* (2006.01)
*G02F 1/1337* (2006.01)
(Continued)

(52) U.S. Cl.
CPC ...... *G02F 1/1337* (2013.01); *G02F 1/134336* (2013.01); *G02F 1/134363* (2013.01);
(Continued)

(58) Field of Classification Search
CPC ............ G02F 1/1337; G02F 1/134336; G02F 1/134363; G02F 1/136286
See application file for complete search history.

(56) References Cited

U.S. PATENT DOCUMENTS

2005/0168666 A1* 8/2005 Kawasaki ............. G02F 1/1362
349/43
2006/0146212 A1* 7/2006 Ahn .................. G02F 1/134363
349/42

(Continued)

FOREIGN PATENT DOCUMENTS

JP 2010-191410 A 9/2010
WO 2013/077262 A1 5/2013

*Primary Examiner* — James Dudek
(74) *Attorney, Agent, or Firm* — Keating & Bennett, LLP

(57) ABSTRACT

An active matrix substrate for a liquid crystal panel of an FFS mode includes a plurality of connecting units in a connecting region in order to electrically connect a common electrode, a first common main wiring 31, and a second common main wiring 32. The connecting unit includes a contact hole 41 that connects a connecting electrode 37 and the first common main wiring 31, the connecting electrode 37 formed integrally with the common electrode, and a contact hole 42 that connects the connecting electrode 37 and the second common main wiring 32. An amorphous Si film 122 of the second common main wiring 32 is formed larger than a main conductor part 131 of the second common main wiring 32 in a position of the contact hole 41, and is covered with SiNx films 151, 152 that are protective insulating films. This prevents the connecting electrode from having a step disconnection at a pattern end of the common main wiring.

13 Claims, 12 Drawing Sheets

(51) Int. Cl.
*G02F 1/1362* (2006.01)
*G02F 1/1343* (2006.01)

(52) U.S. Cl.
CPC ............. *G02F 1/136286* (2013.01); *G02F 2001/13629* (2013.01)

(56) References Cited

U.S. PATENT DOCUMENTS

| | | | | |
|---|---|---|---|---|
| 2009/0135322 | A1* | 5/2009 | Kim | G02F 1/134336 349/37 |
| 2010/0187532 | A1* | 7/2010 | Nagano | G02F 1/136286 257/59 |
| 2014/0300852 | A1* | 10/2014 | Yoshida | G02F 1/1339 349/143 |
| 2015/0346565 | A1* | 12/2015 | Okumoto | G02F 1/134363 257/72 |
| 2017/0068140 | A1* | 3/2017 | Hayashi | H01L 27/124 |

* cited by examiner

ACTIVE MATRIX SUBSTRATE, LIQUID CRYSTAL PANEL, AND METHOD FOR MANUFACTURING ACTIVE MATRIX SUBSTRATE

TECHNICAL FIELD

The present invention relates to a display device, and particularly relates to an active matrix substrate having a common electrode, a liquid crystal panel including the active matrix substrate, and a method for manufacturing the active matrix substrate having the common electrode.

BACKGROUND ART

A liquid crystal display device has been widely used as a thin, light-weight, and low power consumption display device. A liquid crystal panel included in the liquid crystal display device has a structure formed by attaching an active matrix substrate and a counter substrate together, and providing a liquid crystal layer between the two substrates. A plurality of gate lines, a plurality of data lines, and a plurality of pixel circuits each including a thin film transistor (hereinafter referred to as TFT) and a pixel electrode are formed on the active matrix substrate.

As a system for applying an electric field to the liquid crystal layer of the liquid crystal panel, a vertical electric field system and a lateral electric field system are known. In a liquid crystal panel of the vertical electric field system, an almost vertical electric field is applied to the liquid crystal layer by using the pixel electrode and a common electrode formed on the counter substrate. In a liquid crystal panel of the lateral electric field system, the common electrode is formed on the active matrix substrate together with the pixel electrode, and an almost lateral electric field is applied to the liquid crystal layer by using the pixel electrode and the common electrode. The liquid crystal panel of the lateral electric field system has an advantage of having a wider view angle than that in the liquid crystal panel of the vertical electric field system.

As the lateral electric field system, an IPS (In-Plane Switching) mode and an FFS (Fringe Field Switching) mode are known. In a liquid crystal panel of the IPS mode, the pixel electrode and the common electrode are each formed in the shape of comb teeth, and are disposed so as not to overlap each other in a plan view. In a liquid crystal panel of the FFS mode, a slit is formed either in the common electrode or the pixel electrode, and the pixel electrode and the common electrode are disposed so as to overlap each other via a protective insulating film in a plan view. The liquid crystal panel of the FFS mode has an advantage of having a higher aperture ratio than that in the liquid crystal panel of the IPS mode.

In the liquid crystal panel of the FFS mode, a common electrode signal to be applied to the common electrode is externally inputted. For applying the inputted common electrode signal to the common electrode, a common main wiring is formed in an outer peripheral portion (referred to as a picture-frame region) of a display region of the active matrix substrate. The common main wiring preferably has a portion (hereinafter referred to as a first common main wiring) formed in the same wiring layer as the gate line, and a portion (hereinafter referred to as a second common main wiring) formed in the same wiring layer as the data line. With the use of two kinds of common main wirings, by properly selecting the wiring layer of the common main wiring at an intersection of the gate line or the data line and the common main wiring, it is possible to reduce the number of times connecting the gate line and the number of times connecting the data line, and reduce the resistance of the gate line and the data line. Further, by selecting the wiring layer with small resistance and forming the common main wiring in the selected wiring layer, the resistance of the common main wiring can be reduced.

In the active matrix substrate having the two kinds of common main wirings, a connecting circuit is needed for electrically connecting the common main wirings formed in different wiring layers. For example, there is used a connecting circuit for electrically connecting the two kinds of common main wirings by using a connecting electrode formed integrally with the common electrode. Patent Document 1 describes an example of the connecting circuit for electrically connecting the common electrode and the two kinds of common main wirings in the liquid crystal panel of the FFS mode.

An active matrix substrate for the liquid crystal panel of the FFS mode is manufactured using five or six photomasks. Patent Document 2 describes a method for manufacturing the active matrix substrate using five photomasks. In the manufacturing method described in Patent Document 2, a semiconductor layer is patterned using a photomask for a source layer, without using a photomask for a semiconductor layer, and a channel region of a TFT is formed using a photomask for a pixel electrode layer.

PRIOR ART DOCUMENT

Patent Documents

[Patent Document 1] International Publication No. WO 2013/77262
[Patent Document 2] Japanese Laid-Open Patent Publication No. 2010-191410

SUMMARY OF THE INVENTION

Problems to be Solved by the Invention

However, when the connecting circuit for electrically connecting the common electrode and the two kinds of common main wirings is formed by using the manufacturing method described in Patent Document 2, the connecting electrode easily has a step disconnection at a pattern end of the second common main wiring (see FIG. 10 described later). When such a step disconnection occurs, rounding occurs in the common electrode signal, leading to the occurrence of display failure such as cross talk.

Accordingly, an object of the present invention is to provide an active matrix substrate that prevents a connecting electrode from having a step disconnection at a pattern end of a common main wiring, and to provide a liquid crystal panel including the active matrix substrate.

Means for Solving the Problems

According to a first aspect of the present invention, there is provided an active matrix substrate, including: a plurality of gate lines formed in a first wiring layer; a plurality of data lines, each of which is a laminated wiring formed in a semiconductor layer, a second wiring layer, and a pixel electrode layer; a plurality of pixel circuits arranged corresponding to intersections of the gate lines and the data lines and each including a switching element and a pixel electrode; a protective insulating film formed in a layer over the gate line, the data line, the switching element, and the pixel electrode; a common electrode formed in a layer over the protective insulating film; a first common main wiring formed in the first wiring layer and having a portion formed in a connecting region; a second common main wiring which is a laminated wiring formed in the semiconductor layer, the second wiring layer, and the pixel electrode layer, and has a portion formed in the connecting region; a connecting electrode formed integrally with the common electrode in the connecting region; and a plurality of connecting units arranged in the connecting region and each including a first contact hole that connects the connecting electrode and the first common main wiring, and a second contact hole that connects the connecting electrode and the second common main wiring, wherein a portion of the second common main wiring which is formed in a layer in the semiconductor layer is formed, in a position of the first contact hole, larger than a portion of the second common main wiring which is formed in the second wiring layer, and is covered with the protective insulating film.

According to a second aspect of the present invention, in the first aspect of the present invention, the active matrix substrate further includes a gate insulating film between the first wiring layer and the semiconductor layer, wherein in the position of the first contact hole, the gate insulating film and the protective insulating film are each formed in a tapered shape so as to become larger toward a lower layer side.

According to a third aspect of the present invention, in the first aspect of the present invention, the first contact hole and the second contact hole are formed separately in the connecting unit.

According to a fourth aspect of the present invention, in the third aspect of the present invention, at least one of shapes of the first contact hole and the second contact hole is either rectangular or polygonal other than being rectangular.

According to a fifth aspect of the present invention, in the third aspect of the present invention, at least one of shapes of the first contact hole and the second contact hole is either circular or elliptical.

According to a sixth aspect of the present invention, in the first aspect of the present invention, the first contact hole and the second contact hole are formed integrally in the connecting unit.

According to a seventh aspect of the present invention, in the sixth aspect of the present invention, a shape of a contact hole integrally formed is either rectangular or polygonal other than being rectangular.

According to an eighth aspect of the present invention, in the sixth aspect of the present invention, a shape of a contact hole integrally formed is either circular or elliptical.

According to a ninth aspect of the present invention, in the first aspect of the present invention, the connecting units are disposed two-dimensionally while forming a space region in the connecting region.

According to a tenth aspect of the present invention, there is provided a liquid crystal panel, including: an active matrix substrate; and a counter substrate disposed so as to face the active matrix substrate, wherein the active matrix substrate includes: a plurality of gate lines formed in a first wiring layer; a plurality of data lines, each of which is a laminated wiring formed in a semiconductor layer, a second wiring layer, and a pixel electrode layer; a plurality of pixel circuits arranged corresponding to intersections of the gate lines and the data lines and each including a switching element and a pixel electrode; a protective insulating film formed in a layer over the gate line, the data line, the switching element, and the pixel electrode; a common electrode formed in a layer over the protective insulating film; a first common main wiring formed in the first wiring layer and having a portion formed in a connecting region; a second common main wiring which is a laminated wiring formed in the semiconductor layer, the second wiring layer, and the pixel electrode layer, and has a portion formed in the connecting region; a connecting electrode formed integrally with the common electrode in the connecting region; and a plurality of connecting units arranged in the connecting region and each including a first contact hole that connects the connecting electrode and the first common main wiring, and a second contact hole that connects the connecting electrode and the second common main wiring, a portion of the second common main wiring which is formed in a layer in the semiconductor layer is formed, in a position of the first contact hole, larger than a portion of the second common main wiring which is formed in the second wiring layer, and is covered with the protective insulating film, the connecting units are disposed two-dimensionally while forming a space region in the connecting region, and the counter substrate has a columnar spacer in a position facing the space region.

According to an eleventh aspect of the present invention, there is provided a method for manufacturing an active matrix substrate including a plurality of connecting units in a connecting region, the method including: a step of forming, in a first wiring layer, a plurality of gate lines and a first common main wiring having a portion formed in the connecting region; a step of forming a gate insulating film and a semiconductor film; a source layer forming step of forming, in a second wiring layer, a first conductor part to be a base of a main conductor part of a plurality of data lines, and a second conductor part to be a base of a main conductor part of a second common main wiring having a portion formed in the connecting region, and patterning the semiconductor film to form a semiconductor part of the data line and a semiconductor part of the second common main wiring; a pixel electrode layer forming step of forming a pixel electrode, an accessory conductor part of the data line, and an accessory conductor part of the second common main wiring, and patterning the first and second conductor parts to form a main conductor part of the data line and a main conductor part of the second common main wiring; a step of forming a protective insulating film in a layer over the pixel electrode, and a step of forming a common electrode in a layer over the protective insulating film, and forming a connecting electrode integrally with the common electrode in the connecting region, wherein in the step of forming the protective insulating film, a first contact hole that connects the connecting electrode and the first common main wiring is formed in a first position in the connecting unit, and a second contact hole that connects the connecting electrode and the second common main wiring is formed in a second position in the connecting unit, in the source layer forming step, in the first position, a layer in the semiconductor layer of the second common main wiring is formed larger than the main conductor part of the second common main wiring, and in the step of forming the protective insulating film, in the first position, the protective insulating film is formed so as to cover the semiconductor part of the second common main wiring.

According to a twelfth aspect of the present invention, in the eleventh aspect of the present invention, in the step of forming the protective insulating film, in the first position, the gate insulating film and the protective insulating film are each formed in a tapered shape so as to become larger toward a lower layer side.

According to a thirteenth aspect of the present invention, in the twelfth aspect of the present invention, the step of forming the protective insulating film includes film formation processing, photoresist formation processing, processing of etching a photoresist while etching the gate insulating film and the protective insulating film with using the photoresist as a mask, and photoresist peeling processing.

Effects of the Invention

According to the first aspect of the present invention, the second common main wiring is formed in a stepwise shape in the position of the first contact hole to provide a stepwise part in the connecting electrode, and hence a level difference of the connecting electrode can be made small. Further, by covering down to the portion of the second common main wiring which is formed in the semiconductor layer, with the protective insulating film in the position of the first contact hole, it is possible to protect the portion of the second common main wiring which is formed in the semiconductor layer and the portion in a layer thereunder at the time of forming the first contact hole, and form the side surface of the first contact hole into such a shape as to facilitate formation of the next layer. Hence, it is possible to prevent the connecting electrode from having a step disconnection at the pattern end of the second common main wiring, and reduce the resistance of the connecting circuit.

According to the second aspect of the present invention, the gate insulating film and the protective insulating film are formed larger toward the lower layer side in the position of the first contact hole, to form the side surface of the first contact hole into such a shape as to further facilitate formation of the next layer, and hence the connecting electrode can be more effectively prevented from having the step disconnection at the pattern end of the second common main wiring.

According to the third aspect of the present invention, the first and second contact holes are formed separately to enable formation of two contact holes with high flexibility.

According to the fourth, fifth, seventh, or eighth aspect of the present invention, even with the use of the contact hole in any shape, it is possible to constitute the connecting unit that connects the connecting electrode, the first common main wiring, and the second common main wiring. According to the fifth or eighth aspect, with the use of the contact hole in a shape without a vertex (circular or elliptical), it is possible to reduce display unevenness caused by rubbing.

According to the sixth aspect of the present invention, the first and second contact holes are formed integrally, to enable reduction in size of the connecting unit and placement of a large number of connecting units in the connecting region. Hence, the electrical connection of the common electrode, the first common main wiring, and the second common main wiring can be made reliably without increasing the connecting resistance. Further, the position of the space region where the connecting unit is not disposed can be decided with high flexibility.

According to the ninth aspect of the present invention, the space region is formed at the time of disposing the connecting unit, to form the columnar spacer in the position that faces the space region on the counter substrate and allow the constant interval between the active matrix substrate and the counter substrate to be held stably.

According to the tenth aspect of the present invention, the columnar spacer is formed in the position facing the space region of the connecting unit on the counter substrate, to allow the constant interval between the active matrix substrate and the counter substrate to be held stably.

According to the eleventh aspect of the present invention, it is possible to manufacture the active matrix substrate, which prevents the connecting electrode from having the step disconnection at the pattern end of the second common main wiring, without increasing the number of processes.

According to the twelfth aspect of the present invention, the gate insulating film and the protective insulating film are formed larger toward the lower layer side in the position of the first contact hole, to enable manufacturing of the active matrix substrate which more effectively prevents the connecting electrode from having the step disconnection at the pattern end of the second common main wiring.

According to the thirteenth aspect of the present invention, in the step of forming the protective insulating film, the photomask is etched while the gate insulating film and the protective insulating film are etched, and hence the gate insulating film and the protective insulating film can be formed larger toward the lower layer side.

MODES FOR CARRYING OUT THE INVENTION

First Embodiment

Figure 1:
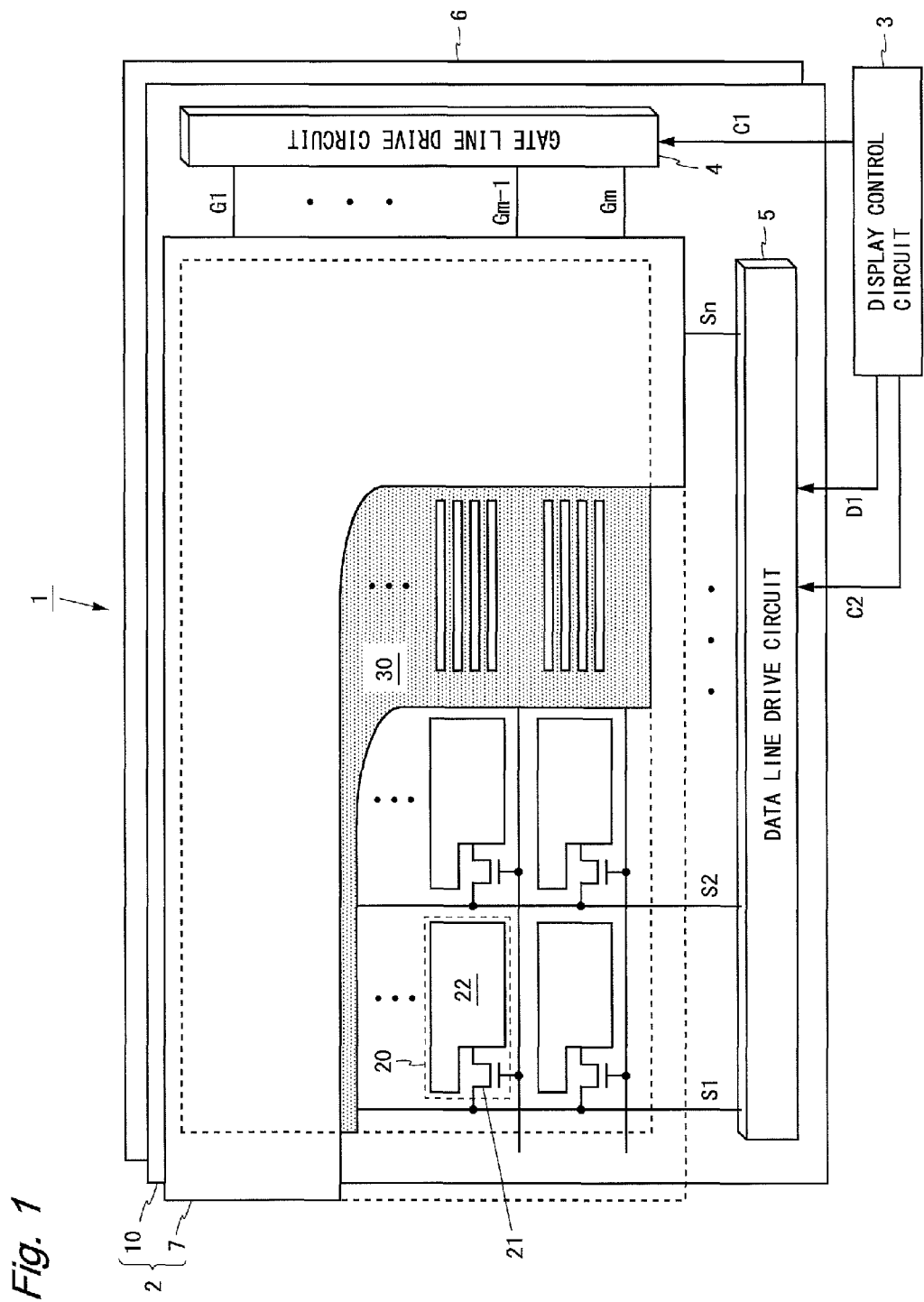
FIG. 1 is a block diagram showing a configuration of a liquid crystal display device provided with an active matrix substrate according to a first embodiment of the present invention.

FIG. 1 is a block diagram showing a configuration of a liquid crystal display device provided with an active matrix substrate according to a first embodiment of the present invention. A liquid crystal display device 1 shown in FIG. 1 includes a liquid crystal panel 2, a display control circuit 3, a gate line drive circuit 4, a data line drive circuit 5, and a backlight 6. Hereinafter, m and n are integers not smaller than 2, i is an integer not smaller than 1 and not larger than m, and j is an integer not smaller than 1 and not larger than n.

The liquid crystal panel 2 is a liquid crystal panel of an FFS mode. The liquid crystal panel 2 has a structure formed by attaching an active matrix substrate 10 and a counter substrate 7 together, and providing a liquid crystal layer between the two substrates. A black matrix (not shown) and the like are formed on the counter substrate 7. m gate lines G1 to Gm, n data lines S1 to Sn, (m×n) pixel circuits 20, a common electrode 30 (dot pattern part), and the like are formed on the active matrix substrate 10. A semiconductor chip to function as the gate line drive circuit 4 and a semiconductor chip to function as the data line drive circuit 5 are mounted on the active matrix substrate 10. Note that FIG. 1 schematically shows the configuration of the liquid crystal display device 1, and shapes of the elements shown in FIG. 1 are not accurate.

Hereinafter, a direction in which the gate line extends (a horizontal direction in the drawing) is referred to as a row direction, and a direction in which the data line extends (a vertical direction in the drawing) is referred to as a column direction. The gate lines G1 to Gm extend in the row direction and are arranged in parallel with each other. The data lines S1 to Sn extend in the column direction and are arranged in parallel with each other. The gate lines G1 to Gm and the data lines S1 to Sn intersect at (m×n) points. The (m×n) pixel circuits 20 are arranged two-dimensionally corresponding to the intersections of the gate lines G1 to Gm and the data lines S1 to Sn.

The pixel circuit 20 includes an N-channel TFT 21 and a pixel electrode 22. The TFT 21 included in the pixel circuit 20 in an i-th row and a j-th column has a gate electrode connected to a gate line Gi, a source electrode connected to a data line Sj, and a drain electrode connected to the pixel electrode 22. A protective insulating film (not shown) is formed in a layer over the gate lines G1 to Gm, the data lines S1 to Sn, the TFT 21, and the pixel electrode 22. The common electrode 30 is formed in a layer over the protective insulating film. The pixel electrode 22 and the common electrode 30 face each other with the protective insulating film interposed therebetween. The backlight 6 is disposed on the back surface side of the liquid crystal panel 2 and irradiates the back surface of the liquid crystal panel 2 with light.

The display control circuit 3 outputs a control signal C1 to the gate line drive circuit 4, and outputs a control signal C2 and a data signal D1 to the data line drive circuit 5. The gate line drive circuit 4 drives the gate lines G1 to Gm based on the control signal C1. The data line drive circuit 5 drives the data lines S1 to Sn based on the control signal C2 and the data signal D1. More specifically, the gate line drive circuit 4 selects one gate line from among the gate lines G1 to Gm in each horizontal period (line period), and applies a high-level voltage to the selected gate line. The data line drive circuit 5 respectively applies n data voltages in accordance with the data signal D1 to the data lines S1 to Sn in each horizontal period. Hence, n pixel circuits 20 are selected within one horizontal period, and n data voltages are respectively written to the selected n pixel circuits 20.

Figure 2:
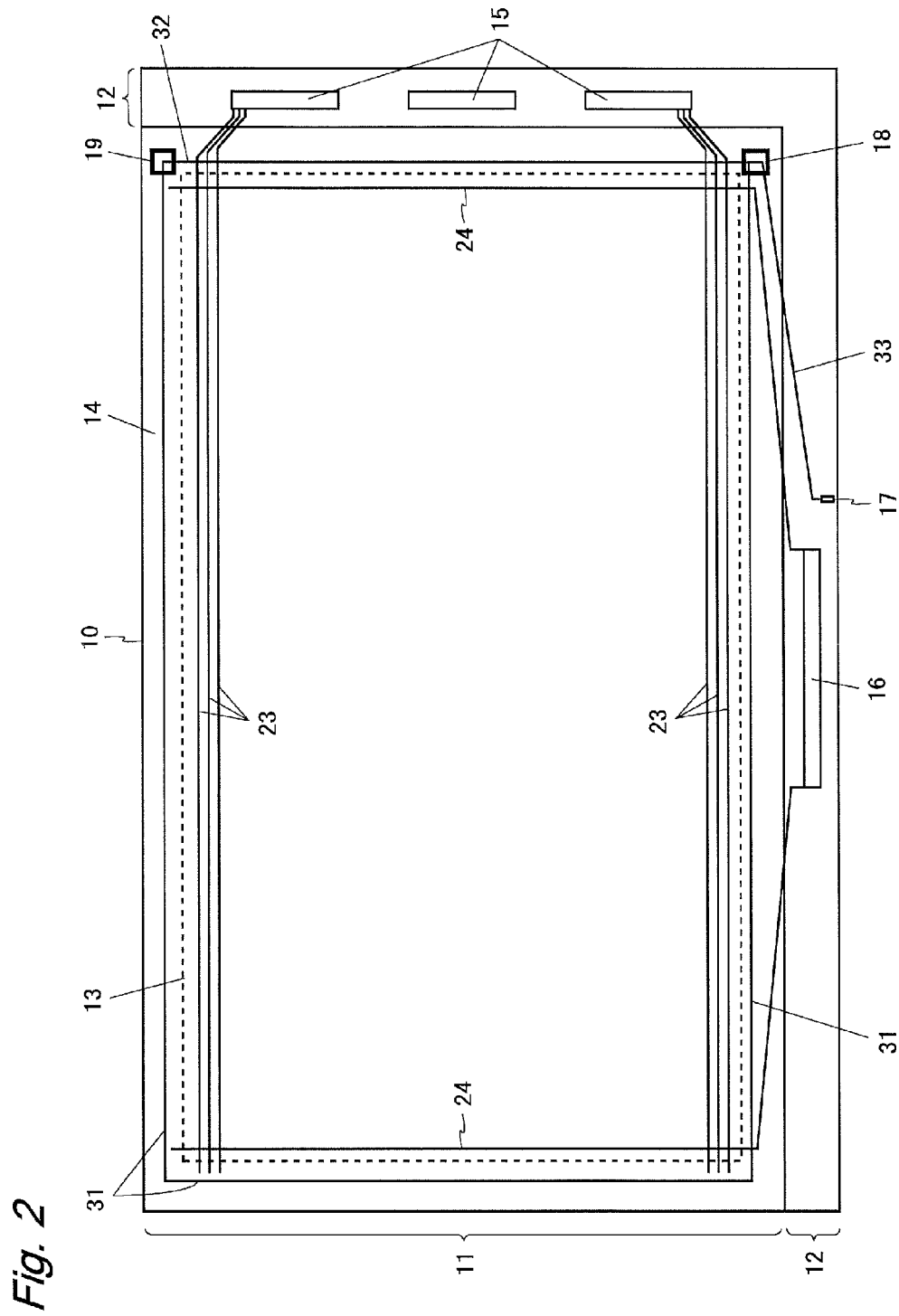
FIG. 2 is a plan view of the active matrix substrate shown in FIG. 1.

FIG. 2 is a plan view of the active matrix substrate 10. Part of elements formed on the active matrix substrate 10 is shown in FIG. 2. As shown in FIG. 2, the active matrix substrate 10 is divided into a counter region 11 facing the counter substrate 7, and a non-counter region 12 not facing the counter substrate 7. In FIG. 2, the non-counter region 12 is located in the right side and the lower side of the counter region 11. A display region 13 (a region indicated by a broken line) for disposing the pixel circuits 20 is set in the counter region 11. A portion remaining after removing the display region 13 from the counter region 11 is referred to as a picture-frame region 14.

The (m×n) pixel circuits 20, the m gate lines 23, and the n data lines 24 are formed in the display region 13. The (m×n) pixel circuits 20 are arranged two-dimensionally in the display region 13. A mounting region 15 for mounting the gate line drive circuit 4 and a mounting region 16 for mounting the data line drive circuit 5 are set in the non-counter region 12.

An external terminal 17 for inputting a common electrode signal is provided to the non-counter region 12. For applying, to the common electrode 30, the common electrode signal inputted through the external terminal 17, a first common main wiring 31 formed in the same wiring layer through the same process as the gate line 23 and a second common main wiring 32 formed in the same wiring layer through the same process as the data line 24 are formed in the picture-frame region 14. In FIG. 2, the first common main wiring 31 is formed in the left side, the upper side, and the lower side of the display region 13, and the second common main wiring 32 is formed in the right side of the display region 13.

A connecting region is set at a corner of the picture-frame region 14. In FIG. 2, a connecting region 18 is set at a lower right corner of the picture-frame region 14, and a connecting region 19 is set at an upper right corner of the picture-frame region 14. As a connecting circuit for electrically connecting the common electrode 30, the first common main wiring 31, and the second common main wiring 32, a plurality of connecting units (not shown) are formed in the connecting regions 18, 19. The external terminal 17 and the first common main wiring 31 are connected using a connection wiring 33 formed in the same wiring layer through the same process as the gate line 23. The connection wiring 33 is formed integrally with the first common main wiring 31.

The active matrix substrate 10 is formed by forming a gate layer, a gate insulating layer, a semiconductor layer, a source layer, a pixel electrode layer, a protective insulating layer, and a common electrode layer over a glass substrate sequentially from the lower layer (details are described later). The gate line 23 and the first common main wiring 31 are formed in the gate layer. The data line 24 and the second common main wiring 32 are laminated wirings formed in the semiconductor layer, the source layer, and the pixel electrode layer. The TFT 21 is formed in the gate layer, the semiconductor layer, and the source layer, the pixel electrode 22 is formed in the pixel electrode layer, and the common electrode 30 is formed in the common electrode layer.

Figure 3:
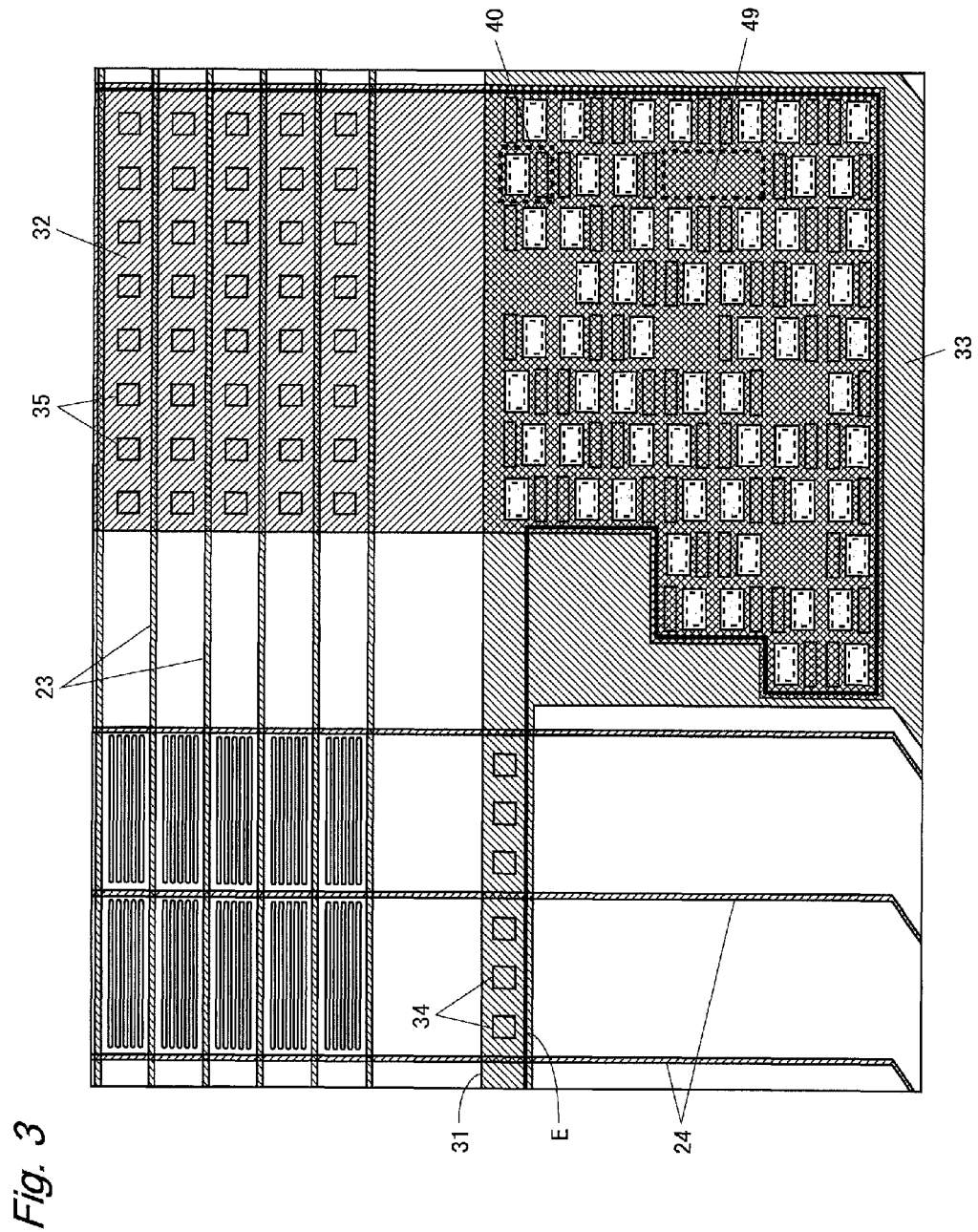
FIG. 3 is a layout diagram of a portion near a connecting region of the active matrix substrate shown in FIG. 1.
Figure 4:
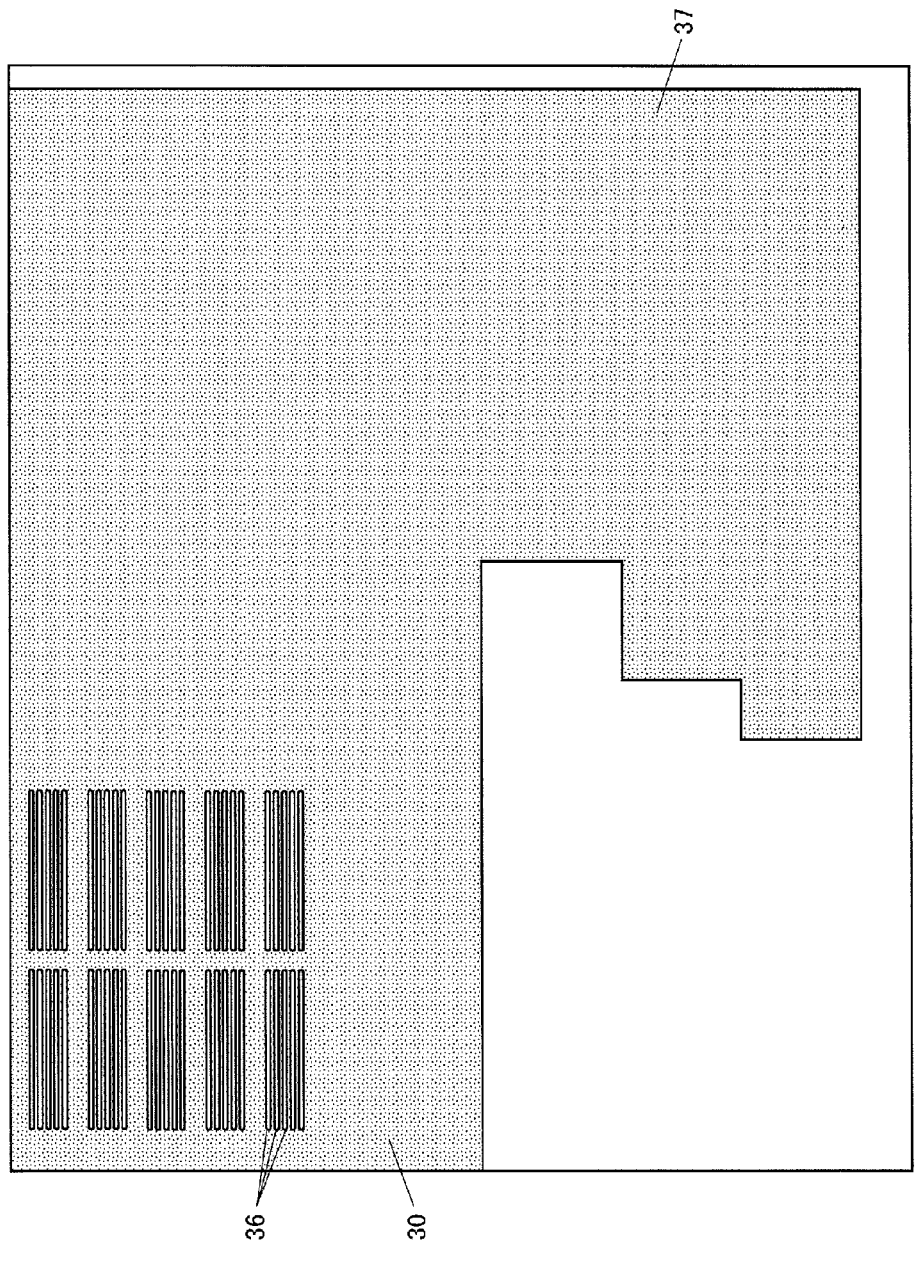
FIG. 4 is a diagram showing a pattern of a common electrode layer in the portion near the connecting region of the active matrix substrate shown in FIG. 1.

FIG. 3 is a layout diagram of a portion near the connecting region 18. In FIG. 3, a region where connecting units 40 are disposed is the connecting region 18. FIG. 3 shows a pattern of the common electrode layer and a pattern other than that pattern in an overlapping manner. In FIG. 3, a thick line provided with symbol E represents the end of the pattern of the common electrode layer. FIG. 4 is a diagram showing the pattern of the common electrode layer. In FIG. 3, for facilitating understanding of the drawing, elements unnecessary for describing the connecting unit 40 (e.g., electrostatic countermeasure circuit, a test circuit, etc.) are omitted out of elements formed on the active matrix substrate 10.

As shown in FIG. 3, the gate line 23 (right down oblique line part) extends in the row direction, and the data line 24 (left down oblique line part) extends in the column direction. The gate line 23 and the data line 24 are formed in different wiring layers. The TFT 21 (not shown in FIG. 3) is formed in the vicinity of the intersection of the gate line 23 and the data line 24. The pixel electrode 22 (not shown in FIG. 3) is formed in a region separated by the gate lines 23 and the data lines 24. The TFT 21 has a gate electrode connected to the gate line 23, a source electrode connected to the data line 24, and a drain electrode connected to the pixel electrode 22. In such a manner, the liquid crystal panel 2 is provided with a plurality of pixel circuits 20 (not shown in FIG. 3) arranged corresponding to intersections of the gate lines 23 and the data lines 24.

The first common main wiring 31 (right down oblique line part) extends in the row direction, and has a portion (hereinafter referred to as a connecting part) formed in the connecting region 18. The second common main wiring 32 (left down oblique line part) extends in the column direction, and has a connecting part.

The common electrode 30 is formed in a layer over the protective insulating film which is formed in a layer over the TFT 21, the pixel electrode 22, the gate line 23, and the data line 24 (i.e., closer side to the liquid crystal layer). As shown in FIG. 4, the common electrode 30 is formed so as to cover the whole surface of the display region 13 except for the following portions. The common electrode 30 has a plurality of slits 36 corresponding to the pixel electrode 22 so as to generate, together with the pixel electrode 22, a lateral electric field to be applied to the liquid crystal layer. In FIG. 4, the common electrode 30 has five slits 36 corresponding to one pixel electrode 22. The length of the slit 36 in the row direction is longer than that in the column direction. The common electrode 30 may have a cutout in a region including a source electrode disposed region and a channel region of the TFT 21.

Further, the common electrode 30 is formed so as to overlap the first common main wiring 31 and the second common main wiring 32 in the inside of the picture-frame region 14 and the outside of the connecting regions 18, 19. In a position where the common electrode 30 and the first common main wiring 31 overlap each other, a plurality of contact holes 34 for connecting the common electrode 30 and the first common main wiring 31 are formed. In a position where the common electrode 30 and the second common main wiring 32 overlap each other, a plurality of contact holes 35 for connecting the common electrode 30 and the second common main wiring 32 are formed.

A connecting electrode 37 is formed in the connecting region 18. The connecting electrode 37 is formed integrally with the common electrode 30 in the connecting region 18 (see FIG. 4). The connecting electrode 37, the connecting part of the first common main wiring 31, and the connecting part of the second common main wiring 32 overlap one another in the connecting region 18. The plurality of connecting units 40 are formed as a connecting circuit in the connecting region 18. As shown in FIG. 3, the connecting units 40 are disposed two-dimensionally while forming a space region 49 in the connecting region 18. The connecting unit 40 includes a contact hole that connects the connecting electrode 37 and the first common main wiring 31, and a contact hole that connects the connecting electrode 37 and the second common main wiring 32 (details are described later). A size of the connecting unit 40 is about several tens of µm sq., for example. Note that the size, the number, and an arrangement form of the connecting units 40 may be freely selected. The configuration of the connecting region 19 is the same as the configuration of the connecting region 18 except that the connection wiring 33 does not exist.

In order to hold a constant interval between the active matrix substrate 10 and the counter substrate 7, columnar spacers (not shown) are formed on the counter substrate 7. On the counter substrate 7, the columnar spacers are disposed with a predetermined density in a position facing the display region 13 and the picture-frame region 14. For example, one columnar spacer with a diameter of about 10 to 15 µm is disposed per several tens of thousands of µm$^2$ to several hundreds of thousands of µm$^2$ of the counter substrate 7. Of the columnar spacers disposed in the position facing the picture-frame region 14, the columnar spacer to be disposed in a position facing the connecting regions 18, 19 is disposed in a position facing the space region 49.

Figure 5:
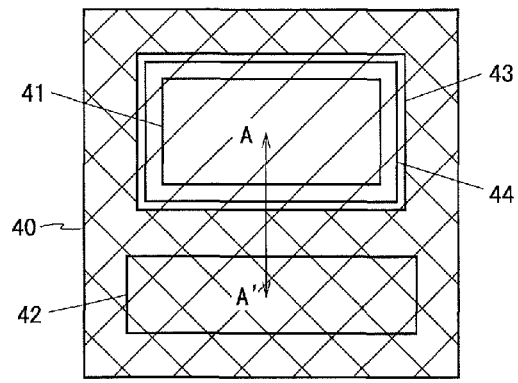
FIG. 5 is a plan view of a connecting unit of the active matrix substrate shown in FIG. 1.
Figure 6:
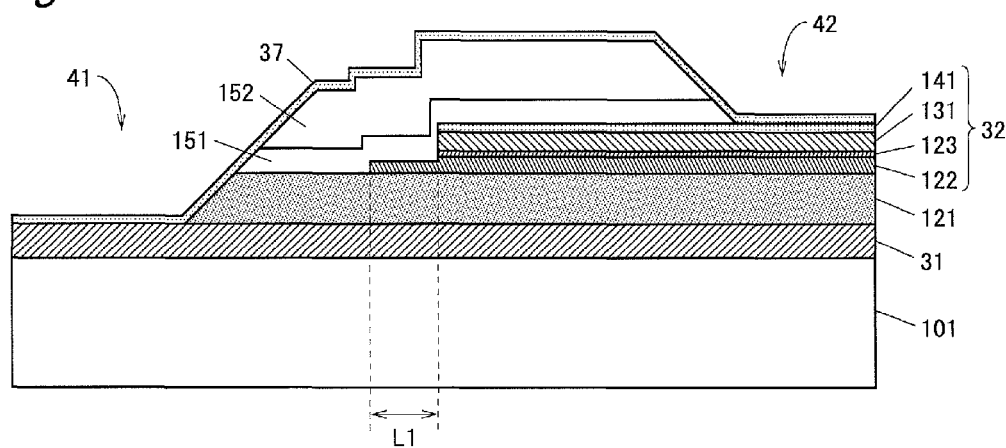
FIG. 6 is a sectional view of the connecting unit shown in FIG. 5.

FIG. 5 is a plan view of the connecting unit 40. FIG. 6 is a sectional view of the connecting unit 40. FIG. 6 shows a cross section taken along line A-A' of FIG. 5. In FIG. 6, the left side is an A side, and the right side is an A' side. In FIG. 6, in a portion where a film laminated on a glass substrate 101 is the thickest (has the largest film thickness), the first common main wiring 31, a SiNx (silicon nitride) film 121, the second common main wiring 32, SiNx films 151, 152, and the connecting electrode 37 are formed over the glass substrate 101 sequentially from the lower layer. The second common main wiring 32 is a laminated wiring formed by laminating, sequentially from the lower layer, an amorphous Si (amorphous silicon) film 122, an n+amorphous Si film 123 doped with phosphor, a main conductor part 131, and an IZO (Indium-Zinc-Oxide) film 141. The SiNx film 121 is a gate insulating film, the amorphous Si film 122 and the n+amorphous Si film 123 form a two-layered semiconductor layer, and the SiNx films 151, 152 are two-layered protective insulating films.

The first common main wiring 31 is formed in the gate layer through the same process as the gate line 23, the second common main wiring 32 is formed in the semiconductor layer, the source layer, and the pixel electrode layer through the same process as the data line 24, and the connecting electrode 37 is formed in the common electrode layer. The connecting electrode 37 and the first common main wiring 31 are formed all over the connecting unit 40. The gate insulating film (SiNx film 121) exists between the gate layer and the source layer, and the protective insulating films (SiNx films 151, 152) exist between the source layer and the common electrode layer. The connecting unit 40 includes a contact hole 41 for connecting the connecting electrode 37 and the first common main wiring 31, and a contact hole 42 for connecting the connecting electrode 37 and the second common main wiring 32. The connecting electrode 37 comes into direct contact with the first common main wiring 31 in the position of the contact hole 41, and is electrically connected to the main conductor part 131 of the second common main wiring 32 via the IZO film 141 in the position of the contact hole 42. With the connecting electrode 37 formed integrally with the common electrode 30, it is possible to electrically connect the common electrode 30, the first common main wiring 31, and the second common main wiring 32 by using the connecting unit 40.

Figure 7:
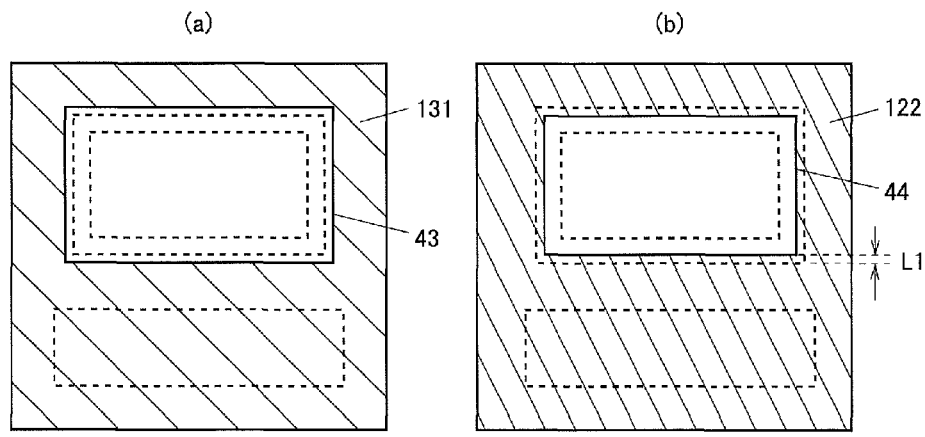
FIG. 7 is a diagram showing an opening formed in the connecting unit shown in FIG. 5.

In the present embodiment, the contact holes 41, 42 are formed separately in the connecting unit 40, and the contact holes 41, 42 each have a rectangular shape. In order to form the contact hole 42, openings are formed in the SiNx films 151, 152. In order to form the contact hole 41, openings are formed in the SiNx film 121, the second common main wiring 32, and the SiNx films 151, 152. An opening 43 having a rectangular shape shown in FIG. 5 is formed in the main conductor part 131 of the second common main wiring 32. The main conductor part 131 of the second common main wiring 32 is formed in a portion (an oblique line part of FIG. 7(a)) except for the opening 43 in the connecting unit 40. An opening 44 having a rectangular shape shown in FIG. 5 is formed in the amorphous Si film 122 of the second common main wiring 32. The amorphous Si film 122 of the second common main wiring 32 is formed in a portion (an oblique line part of FIG. 7(b)) except for the opening 44 in the connecting unit 40.

As shown in FIG. 6, in the position of the contact hole 41, the connecting electrode 37 has a portion formed in a stepwise shape and a portion formed in a slope shape (hereinafter, the former is referred to as a stepwise part and the latter is referred to as a slope part). For forming the stepwise part, the amorphous Si film 122 of the second common main wiring 32 is formed larger than the main conductor part 131 of the second common main wiring 32 by a predetermined length L1 in the position of the contact hole 41. Each side of the opening 44 formed in the amorphous Si film 122 is shorter by a length (2×L1) than each corresponding side of the opening 43 formed in the main conductor part 131 (see FIG. 7). The amorphous Si film 122 is formed larger than the main conductor part 131 by the length L1, and the SiNx films 151, 152, and the connecting electrode 37 are formed thereon, to form the stepwise part of the connecting electrode 37.

In order to form the slope part, the SiNx films 151, 152 are formed so as to cover the amorphous Si film 122 in the position of the contact hole 41. Further, the SiNx films 121, 151, 152 are each formed into a tapered shape so as to become larger toward the lower layer side in the position of the contact hole 41. The SiNx films 121, 151, 152 are formed larger toward the lower layer side, and the connecting electrode 37 is formed thereon, to form the slope part of the connecting electrode 37.

Hereinafter, a method for manufacturing the active matrix substrate 10 is described with reference to FIGS. 8A to 8K. (a) to (d) in FIGS. 8A to 8K each show processes of forming the gate line 23, the data line 24, the TFT 21, and the connecting unit 40.

Figure 8A:
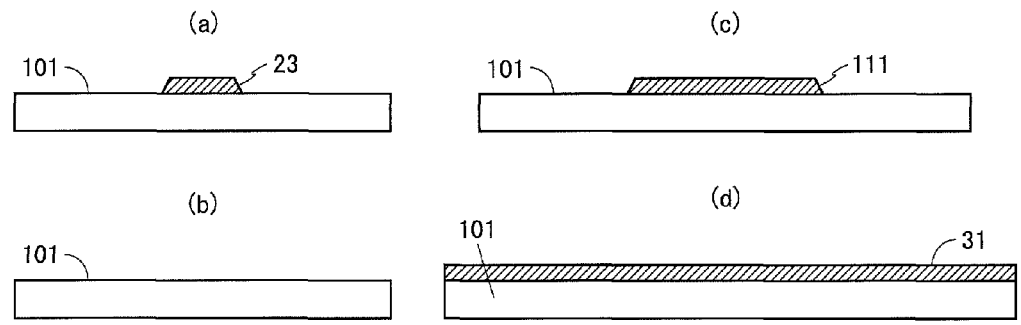
FIG. 8A is a diagram showing a method for manufacturing the active matrix substrate shown in FIG. 1.

(First Process) Formation of Gate Layer Pattern (FIG. 8A)

Ti (titanium), Al (aluminum), and Ti are formed successively on the glass substrate 101 by sputtering. Subsequently, a gate layer is patterned using photolithography and etching to form the gate line 23, the gate electrode 111 of the TFT 21, the first common main wiring 31, and the like. Patterning using photolithography and etching refers to the following processing. First, a photoresist is applied to the substrate. Next, the substrate is covered with a photomask having an intended pattern and is exposed to light, thereby to make a photoresist having the same pattern as that of the photomask remain on the substrate. Subsequently, the substrate is etched using the remaining photoresist as a mask, to form a pattern on the surface of the substrate. Finally, the photoresist is peeled off.

Figure 8B:
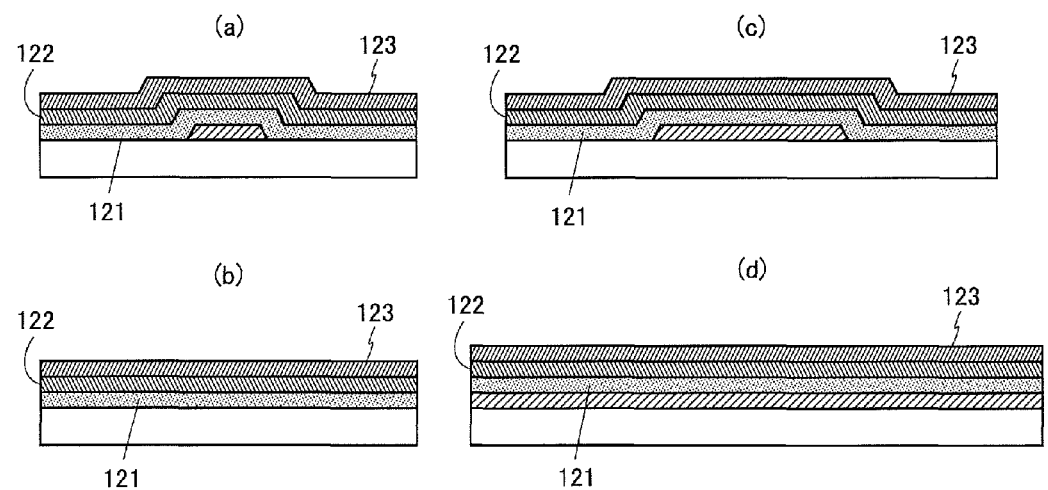
FIG. 8B is a diagram continued from FIG. 8A.

(Second Process) Formation of Semiconductor Layer (FIG. 8B)

The SiNx film 121 to be the gate insulating film, the amorphous Si film 122, and the n+amorphous Si film 123 are formed successively on the substrate shown in FIG. 8A by CVD (Chemical Vapor Deposition). In the second process, the semiconductor layer is not patterned. Patterning of the semiconductor layer is performed together with patterning of the source layer in a third process.

Figure 8C:
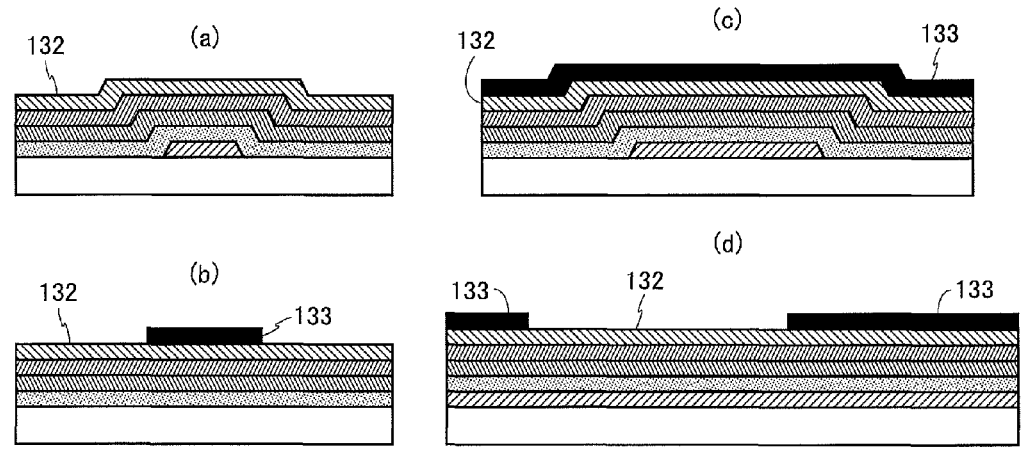
FIG. 8C is a diagram continued from FIG. 8B.
Figure 8D:
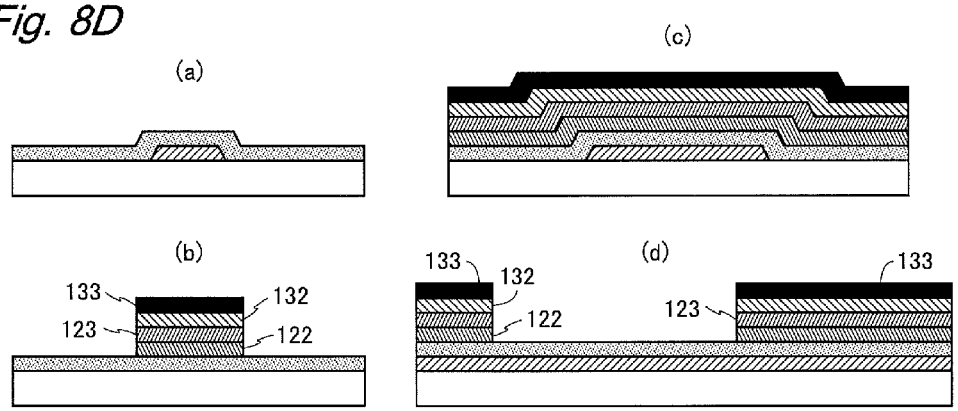
FIG. 8D is a diagram continued from FIG. 8C.
Figure 8E:
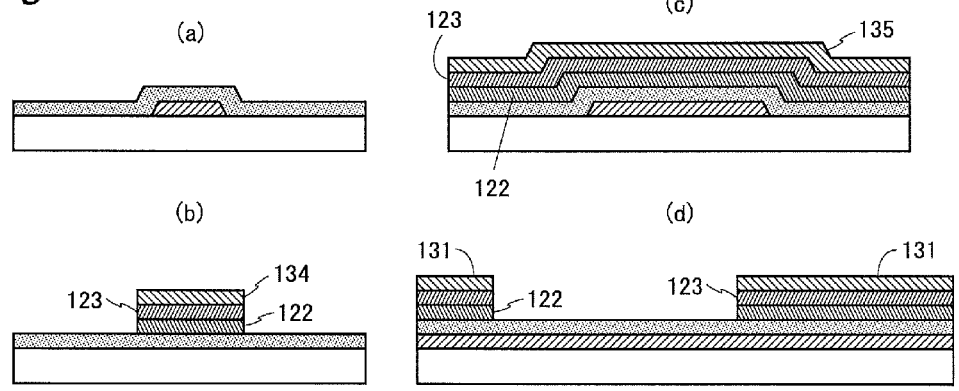
FIG. 8E is a diagram continued from FIG. 8D.

(Third Process) Formation of Source Layer Pattern (FIGS. 8C to 8E)

A MoNb (molybdenum niobium) film 132 is formed on the substrate shown in FIG. 8B by sputtering. Subsequently, the source layer and the semiconductor layer are patterned using photolithography and etching to form a main conductor part 134 of the data line 24, a conductor part 135 of the TFT 21, the main conductor part 131 of the second common main wiring 32, and the like. The conductor part 135 of the TFT 21 is formed in the positions of the source electrode, the drain electrode, and the channel region of the TFT 21. In the third process, there is used a photomask for making a photoresist 133 remain in the positions of the main conductor parts 131, 134, the conductor part 135, and the like. For this reason, after exposure to light, the photoresist 133 remains in the positions of the main conductor parts 131, 134, the conductor part 135, and the like (FIG. 8C). Using the photoresist 133 as a mask, the MoNb film 132 formed in the third process is at first etched, and then the n+amorphous Si film 123 and the amorphous Si film 122 formed in the second process are etched successively (FIG. 8D). The amorphous Si film 122 and the n+amorphous Si film 123 are thereby patterned in almost the same shape as that of the source layer. Finally, the photoresist 133 is peeled off to obtain a substrate shown in FIG. 8E. In the substrate shown in FIG. 8E, the remaining unetched MoNb film 132 becomes the main conductor part 134 of the data line 24, the conductor part 135 of the TFT 21, the main conductor part 131 of the second common main wiring 32, and the like. In the substrate shown in FIG. 8E, the amorphous Si film 122 and the n+amorphous Si film 123 exist in layers under the main conductor part 134 of the data line 24, the conductor part 135 of the TFT 21, the main conductor part 131 of the second common main wiring 32.

(Fourth Process) Formation of Pixel Electrode (FIGS. 8F to 8I)

Figure 8F:
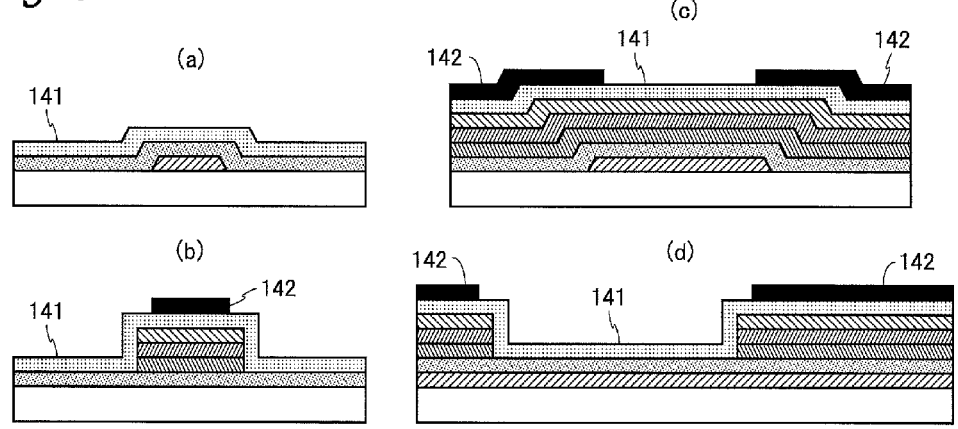
FIG. 8F is a diagram continued from FIG. 8E.
Figure 8G:
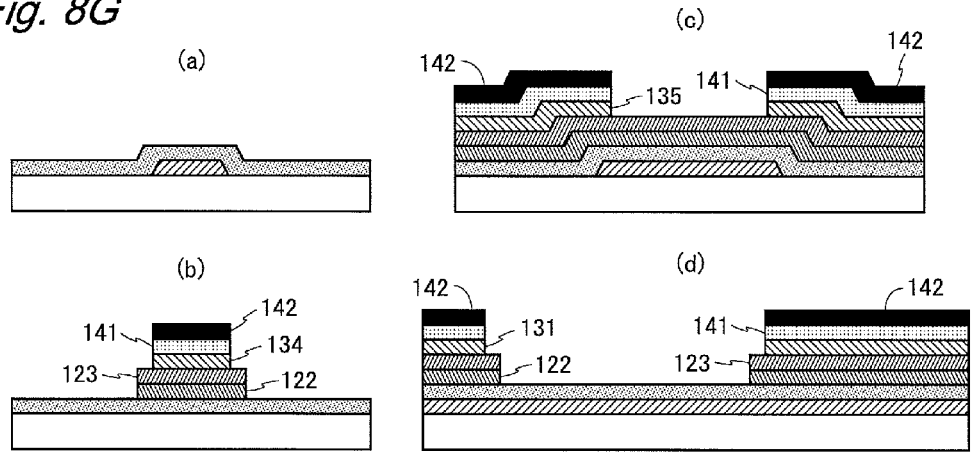
FIG. 8G is a diagram continued from FIG. 8F.
Figure 8H:
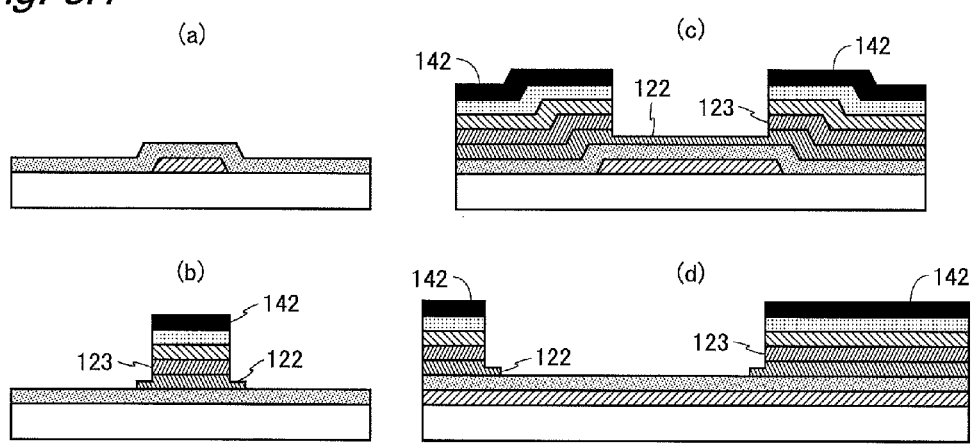
FIG. 8H is a diagram continued from FIG. 8G.

An IZO film 141 to be the pixel electrode 22 is formed on the substrate shown in FIG. 8E by sputtering. Subsequently, the pixel electrode layer is patterned using photolithography and etching. In the fourth process, there is used a photomask for making a photoresist 142 remain in the position of the pixel electrode 22 and the position of the source layer pattern (except for the position of the channel region of the TFT 21). For this reason, after exposure to light, the photoresist 142 remains in the position of the pixel electrode 22 and the position of the source layer pattern except for the position of the channel region of the TFT 21 (FIG. 8F). Using the photoresist 142 as a mask, the IZO film 141 and the conductor part 135 existing in the position of the channel region of the TFT 21 are at first etched by wet etching, and then the n+amorphous Si film 123 existing in the position of the channel region of the TFT 21 is etched by dry etching (FIGS. 8G and 8H). FIG. 8G shows a substrate when etching of the conductor part 135 is completed. FIG. 8H shows a substrate when etching of the n+amorphous Si film 123 is completed. As shown in FIG. 8H, a film thickness of the amorphous Si film 122 existing in the channel region of the TFT 21 becomes thin by dry etching. Finally, the photoresist 142 is peeled off to obtain a substrate shown in FIG. 8I. In the substrate shown in FIG. 8I, the channel region of the TFT 21 is formed, and the source electrode 143 and the drain electrode 144 of the TFT 21 come into a separate state. The IZO film 141 remains in a layer over the main conductor part 134 of the data line 24, the source electrode 143, and the drain electrode 144 of the TFT 21, and the main conductor part 131 of the second common main wiring 32.

In the manufacturing method according to the present embodiment, the shape of the amorphous Si film 122 of the second common main wiring 32 in the completed substrate is decided in accordance with a pattern of a photomask used in the third process (hereinafter referred to as a photomask for the source layer) (see FIGS. 8D and 8H). Meanwhile, the shape of the main conductor part 131 of the second common main wiring 32 in the completed substrate is decided in accordance with a pattern of a photomask used in the fourth process (hereinafter referred to as a photomask for the pixel electrode layer). In order to form the amorphous Si film 122 larger than the main conductor part 131 by the length L1 in the position of the contact hole 41, the pattern of the photomask for the source layer is made larger than the pattern of the photomask for the pixel electrode layer by the length L1 in the position of the contact hole 41.

Figure 8I:
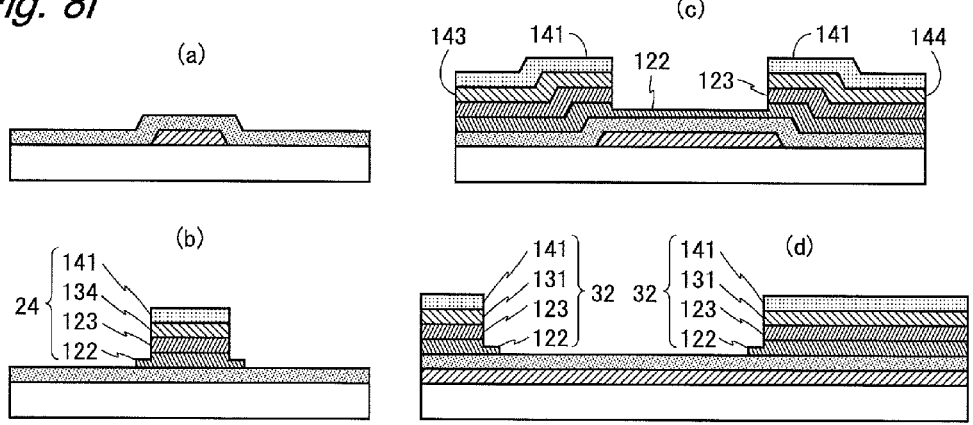
FIG. 8I is a diagram continued from FIG. 8H.
Figure 8J:
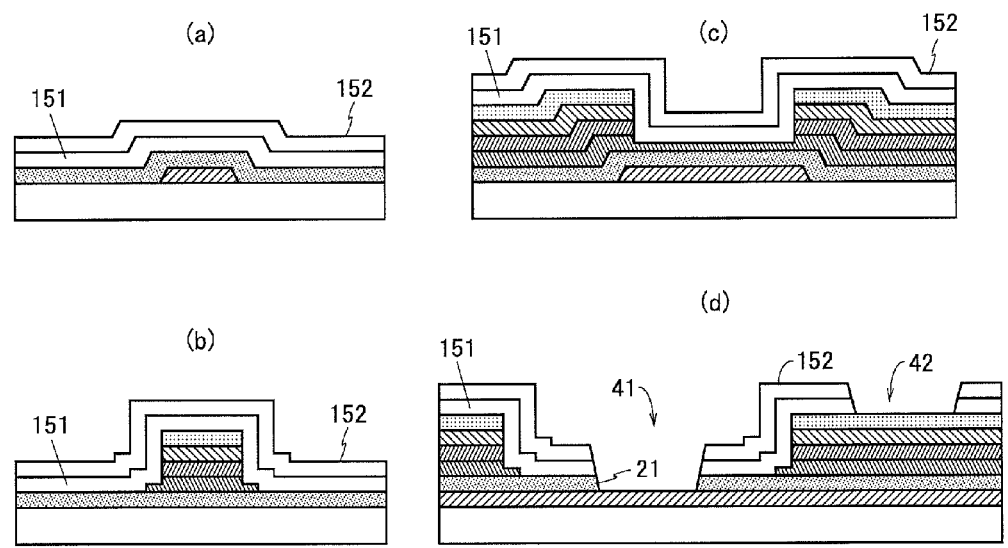
FIG. 8J is a diagram continued from FIG. 8I.

(Fifth Process) Formation of Protective Insulating Film (FIG. 8J)

Two-layered SiNx films 151, 152 to be the protective insulating film are sequentially formed on the substrate shown in FIG. 8I by CVD. Film formation conditions for the lower SiNx film 151 and film formation conditions for the upper SiNx film 152 are different. For example, a high-density thin film formed under a high temperature condition is used as the lower SiNx film 151, and a low-density thin film formed under a low temperature condition is used as the upper SiNx film 152. Subsequently, the two-layered SiNx films 151, 152 formed in the fifth process and the SiNx film 121 formed in the second process are patterned using photolithography and etching. As shown in FIG. 8J(d), the contact hole 41 penetrating the SiNx films 121, 151, 152, and the contact hole 42 penetrating the SiNx films 151, 152 are formed in a position for forming the connecting unit 40.

Figure 9:
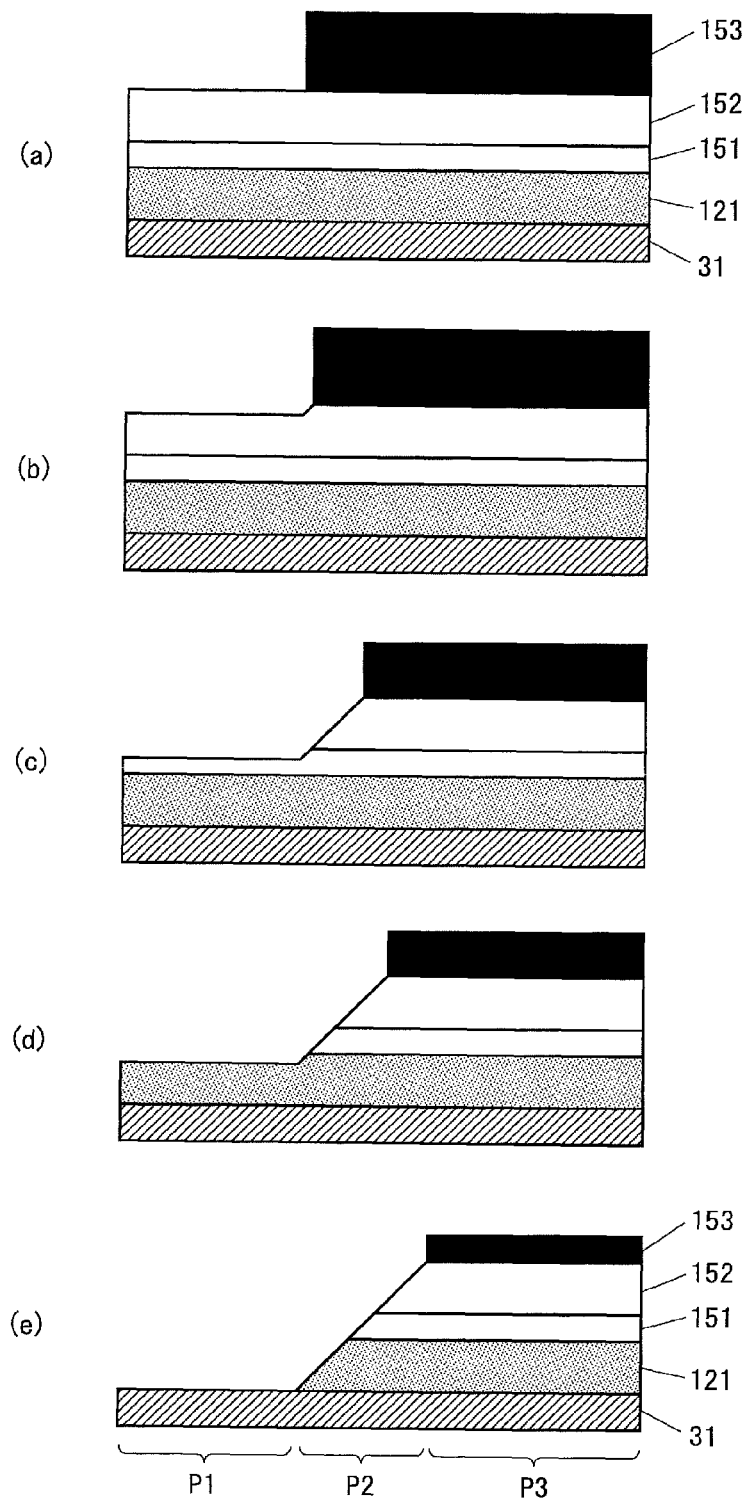
FIG. 9 is a diagram for describing etching of a fifth process included in the above manufacturing method.

With reference to FIG. 9, the etching of the fifth process is described. In the fifth process, processing for forming the two-layer SiNx films 151, 152, processing for forming a photoresist 153, processing for etching the SiNx films 121, 151, 152, and processing for peeling off the photoresist 153 are sequentially performed. Before the start of etching (FIG. 9(a)), the SiNx films 121, 151, 152 have been formed over the first common main wiring 31 sequentially from the lower layer, and the photoresist 153 has been formed on the SiNx film 152. In etching of the fifth process, while the SiNx films 121, 151, 152 are etched using the photoresist 153 as a mask, the photoresist 153 itself is etched. This makes the photoresist 153 gradually becomes thinner and smaller with the lapse of time (FIGS. 9(a) to 9(e)). At the completion of the etching (FIG. 9(e)), in a portion P1 where the photoresist 153 does not exist from the start, the SiNx films 121, 151, 152 are etched and disappeared. In a portion P3 where the photoresist 153 exists to the end, the SiNx films 121, 151, 152 remain without being etched. In a portion P2 where the photoresist 153 has disappeared in the middle of the process, the SiNx films 121, 151, 152 are etched in an amount corresponding to the time after the disappearance of the photoresist 153. Accordingly, by etching of the fifth process, the SiNx films 121, 151, 152 can be formed larger toward the lower layer side.

In the manufacturing method according to the present embodiment, the shapes of the SiNx films 151, 152 in the completed substrate are decided in accordance with a pattern of a photomask used in the fifth process (hereinafter referred to as a photomask for the protective insulating film). In order to form the SiNx films 151, 152 so as to cover the amorphous Si film 122 of the second common main wiring 32 in the position of the contact hole 41, the pattern of the photomask for the protective insulating film is made larger than the pattern of the photomask for the source layer in the position of the contact hole 41. As described above, the photoresist 153 is cut down and reduced during the etching of the fifth process. Considering this point, in the position of the contact hole 41, the pattern of the photomask for the protective insulating film is made even larger than the pattern of the photomask for the source layer by adding a margin. For example, in order for the SiNx films 151, 152 to cover the amorphous Si film 122 of the second common main wiring 32, in consideration of alignment deviation and variation in exposed amount at the time of performing photolithography, when a size difference of 5 μm is required between the pattern of the photomask for the protective insulating film and the pattern of the photomask for the source layer, a margin of, for example, 2 μm corresponding to an amount by which the photoresist 153 is to be cut down and reduced may be added to make the size difference between the two patterns be 7 μm.

Figure 8K:
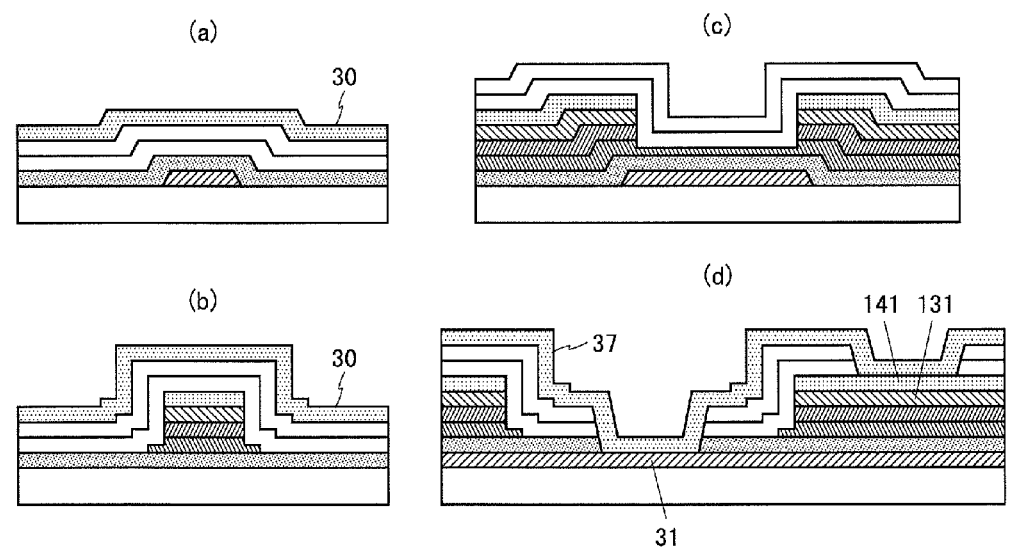
FIG. 8K is a diagram continued from FIG. 8J.

(Sixth Process) Formation of Common Electrode (FIG. 8K)

An IZO film to be the common electrode 30 is formed on the substrate shown in FIG. 8J by sputtering. Subsequently, a common electrode layer is patterned using photolithography and etching to form the common electrode 30 and the connecting electrode 37. As shown in FIG. 8K(d), the connecting electrode 37 comes into direct contact with the first common main wiring 31 in the position of the contact hole 41, and is electrically connected to the main conductor part 131 of the second common main wiring 32 via the IZO film 141 in the position of the contact hole 42.

A photomask used in the sixth process has a pattern corresponding to the slits 36. The use of such a photomask allows formation of the common electrode 30 having the slits 36. By performing the first to sixth processes described above, it is possible to manufacture the active matrix substrate 10 having a sectional structure shown in FIG. 8K.

In the manufacturing method according to the present embodiment, photolithography is performed using the different photomasks in the first and third to sixth processes, and photolithography is not performed in the second process. The number of photomasks used in the manufacturing method according to the present embodiment is five in total. When the gate line 23 is formed in the first process and when the main conductor part 134 of the data line 24, and the like are formed in the third process, Cu (copper), Mo (molybdenum), Al, Ti, TiN (titanium nitride), an alloy of these, or a laminated film of these metals may be used in place of the above materials. For example, as the wiring materials for the gate line 23, the main conductor part 134 of the data line 24, and the like, there may be used a three-layered film formed by laminating an Al alloy in a layer over MoNb, and further laminating MoNb in a layer over the Al alloy. Further, when the pixel electrode 22 is formed in the fourth process and when the common electrode 30 and the connecting electrode 37 are formed in the sixth process, ITO (Indium Tin Oxide) may be used in place of IZO. Moreover, when the protective insulating film is formed in the fifth process, a one-layered SiNx film may be formed in place of the two-layered SiNx films. Alternatively, SiOx (silicon oxide) films, SiON (silicon oxy-nitride) films, or laminated films of these may be used in place of the SiNx films.

In the manufacturing method according to the present embodiment, thicknesses of a variety of films formed on the substrate are preferably decided in accordance with materials, functions, and the like of the films. The thickness of the film is about 10 nm to 1 μm, for example. Hereinafter, one example of the film thickness is shown. For example, in the second process, the SiNx film 121 with a thickness of 360 to 450 nm, the amorphous Si film 122 with a thickness of 100 to 200 nm, and the n+amorphous Si film 123 with a thickness of 30 to 80 nm may be formed successively. In the third process, the MoNb film 132 with a thickness of 180 to 220 nm is formed, and in the fourth process, the IZO film 141 with a thickness of 50 to 80 nm is formed. In the fifth process, the SiNx film 151 with a thickness of 220 to 280 nm and the SiNx film 152 with a thickness of 450 to 550 nm are formed, and in the sixth process, the IZO film with a thickness of 110 to 140 nm is formed. In this case, for example, the length L1 (the difference in size between the amorphous Si film 122 and the main conductor part 131 in the position of the contact hole 41) is set to 1 μm or larger (e.g., 1.5 μm).

Hereinafter, effects of the active matrix substrate 10 according to the present embodiment are described. As a comparative example, there is considered an active matrix substrate where the amorphous Si film 122 of the second common main wiring 32 is formed in the same size as the main conductor part 131 of the second common main wiring 32 and is not covered with the SiNx films 151, 152 in the position of the contact hole 41.

Figure 10:
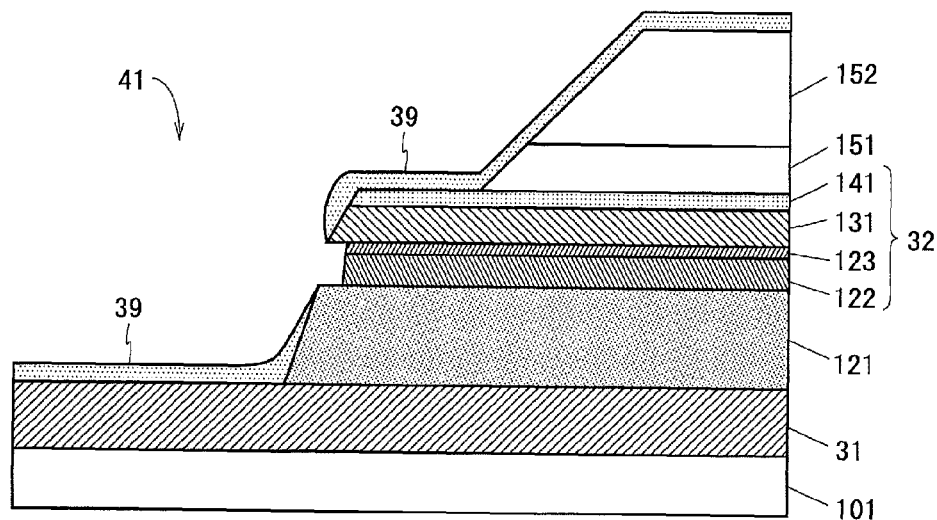
FIG. 10 is a sectional view of a connecting unit of an active matrix substrate according to a comparative example.

FIG. 10 is a sectional view of a connecting unit of an active matrix substrate according to the comparative example. FIG. 10 shows a cross section of the contact hole 41 that connects a connecting electrode 39 and the first common main wiring 31. Note that in FIG. 10, elements other than the connecting electrode are provided with the same numerals as those in FIG. 6 so as to facilitate comparison.

In the active matrix substrate according to the comparative example, in the position of the contact hole 41, the amorphous Si film 122 and the main conductor part 131 are formed in the same size. Hence, the connecting electrode 39 has no stepwise part and has a large level difference. Further, the amorphous Si film 122 is not covered with the SiNx films 151, 152. For this reason, when the contact hole 41 is formed, the gate insulating film 121, the amorphous Si film 122, and the n+amorphous Si film 123 are etched, and the side surface of the contact hole 41 comes into such a state where formation of the next layer is difficult. Specifically, the inclination of the side surface of the contact hole 41 becomes large, or a recess is formed on the side surface of the contact hole 41. In the example shown in FIG. 13, a recess has been formed in the position of the amorphous Si film 122 and the n+amorphous Si film 123. As thus described, in the active matrix substrate according to the comparative example, since the connecting electrode 39 has the large level difference and the side surface of the contact hole 41 comes into such a state where formation of the next layer is difficult, the connecting electrode 39 easily has a step disconnection at the pattern end of the second common main wiring 32.

In contrast, in the active matrix substrate 10 according to the present embodiment, the amorphous Si film 122 of the second common main wiring 32 is formed larger than the main conductor part 131 of the second common main wiring 32 in the position of the contact hole 41. Hence, the connecting electrode 37 has the stepwise part and a small level difference. Further, the amorphous Si film 122 of the second common main wiring 32 is covered with the SiNx films 151, 152 in the position of the contact hole 41. Thus, when the contact hole 41 is formed, the gate insulating film 121, the amorphous Si film 122, and the n+amorphous Si film 123 are not etched, and the side surface of the contact hole 41 is formed into such a shape as to facilitate formation of the next layer. As thus described, in the active matrix substrate 10 according to the present embodiment, since the connecting electrode 37 has the small level difference and the side surface of the contact hole 41 is formed into such a shape as to facilitate formation of the next layer, the connecting electrode 37 can be prevented from having the step disconnection at the pattern end of the second common main wiring 32.

Further, the SiNx films 121, 151, 152 are each formed into a tapered shape so as to become larger toward the lower layer side in the position of the contact hole 41. The side surface of the contact hole 41 is thus formed into such a shape as to further facilitate formation of the next layer, and hence the connecting electrode can be more effectively prevented from having the step disconnection at the pattern end of the second common main wiring 32.

Further, the active matrix substrate 10 does not include the connecting circuit including two large contact holes, but includes as the connecting circuit a plurality of connecting units 40 each including two small contact holes 41, 42. The connecting units 40 are disposed two-dimensionally while forming the space region 49 in each of the connecting regions 18, 19. The columnar spacer formed on the counter substrate 7 is disposed in a position facing the space region 49. This prevents the columnar spacer from falling into the contact holes 41, 42 of the connecting unit 40. Accordingly, the constant interval between the active matrix substrate 10 and the counter substrate 7 can be held stably. Further, the connecting unit 40 is disposed in any position but the position facing the columnar spacer, to enable reduction in resistance of the connecting circuit.

Moreover, the active matrix substrate 10 includes, other than the connecting unit 40, the contact hole 34 that connects the common electrode 30 and the first common main wiring 31, and the contact hole 35 that connects the common electrode 30 and the second common main wiring 32 (FIG. 3). Therefore, when a connection failure occurs in the connecting unit 40, the common electrode 30 and two kinds of common main wirings 31, 32 can be electrically connected using the contact holes 34, 35, and when a connection failure occurs in the contact holes 34, 35, the common electrode 30 and the two kinds of common main wirings 31, 32 can be electrically connected using the connecting unit 40.

As shown above, the active matrix substrate 10 according to the present embodiment includes the plurality of gate lines 23 formed in a first wiring layer (gate layer); the plurality of data lines 24, each of which is a laminated wiring formed in the semiconductor layer, a second wiring layer (source layer), and the pixel electrode layer; the plurality of pixel circuits 20 arranged corresponding to intersections of the gate lines 23 and the data lines 24 and each including a switching element (TFT 21) and the pixel electrode 22; the protective insulating film (SiNx films 151, 152) formed in a layer over the gate line 23, the data line 24, the switching element, and the pixel electrode 22; the common electrode 30 formed in a layer over the protective insulating film; the first common main wiring 31 formed in the first wiring layer and having a portion formed in the connecting regions 18, 19; the second common main wiring 32 which is a laminated wiring formed in the semiconductor layer, the second wiring layer, and the pixel electrode layer, and has a portion formed in the connecting regions 18, 19; the connecting electrode 37 formed integrally with the common electrode 30 in the connecting regions 18, 19; and the plurality of connecting units 40 disposed in the connecting regions 18, 19. Each connecting unit 40 includes a first contact hole (contact hole 41) that connects the connecting electrode 37 and the first common main wiring 31, and a second contact hole (contact hole 42) that connects the connecting electrode 37 and the second common main wiring 32. A portion (amorphous Si film 122) of the second common main wiring 32 which is formed in a layer in the semiconductor layer is formed, in the position of the first contact hole, larger than a portion (main conductor part 131) of the second common main wiring which is formed in the second wiring layer, and is covered with the protective insulating film. In such a manner, by forming the second common main wiring 32 into a stepwise shape in the position of the first contact hole, it is possible to provide the stepwise part in the connecting electrode 37, and make the level difference of the connecting electrode 37 small. Further, by covering down to the portion (amorphous Si film 122) of the second common main wiring which is formed in the semiconductor layer, with the protective insulating film in the position of the first contact hole, it is possible to protect the portion of the second common main wiring which is formed in the semiconductor layer and a portion in a layer thereunder at the time of forming the first contact hole, and form the side surface of the first contact hole into such a shape as to facilitate formation of the next layer. Hence, it is possible to prevent the connecting electrode from having a step disconnection at the pattern end of the second common main wiring 32, and reduce the resistance of the connecting circuit.

Further, the active matrix substrate 10 is provided with the gate insulating film (SiNx film 121) between the first wiring layer and the semiconductor layer, and in the position of the first contact hole, the gate insulating film and the protective insulating film are each formed into the tapered shape so as to become larger toward the lower layer side. The side surface of the first contact hole is thus formed into such a shape as to further facilitate formation of the next layer, and hence the connecting electrode 37 can be more effectively prevented from having the step disconnection at the pattern end of the second common main wiring 32. Further, since the first and second contact holes are formed separately in the connecting unit 40, the two contact holes can be formed with high flexibility. Moreover, the connecting units 40 are disposed two-dimensionally while forming the space region 49 in the connecting regions 18, 19. Hence, the columnar spacer is disposed in the position facing the space region 49 on the counter substrate 7, and the constant interval between the active matrix substrate 10 and the counter substrate 7 can be held stably.

Further, the liquid crystal panel 2 according to the present embodiment includes the active matrix substrate 10, and the counter substrate 7 disposed facing the active matrix substrate 10. The connecting units 40 are disposed two-dimensionally while forming the space region 49 in the connecting regions 18, 19, and the counter substrate 7 has the columnar spacer in the position facing the space region 49. Accordingly, the constant interval between the active matrix substrate 10 and the counter substrate 7 can be held stably.

The above-described method for manufacturing the active matrix substrate 10 includes: a step (first process) of forming, in the first wiring layer, the plurality of gate lines 23 and the first common main wiring 31 having a portion formed in the connecting regions 18, 19; a step (second process) of forming the gate insulating film (SiNx film 121) and a semiconductor film (amorphous Si film 122 and n+amorphous Si film 123); a source layer forming step (third process) of forming, in the second wiring layer, a first conductor part (main conductor part 134 shown in FIG. 8E(b)) to be a base of the main conductor part of the plurality of data lines 24, and a second conductor part (main conductor part 131 shown in FIG. 8E(d)) to be a base of the main conductor part of the second common main wiring 32 having a portion formed in the connecting regions 18, 19, and patterning the semiconductor film to form a semiconductor part (amorphous Si film 122 and n+amorphous Si film 123 shown in FIG. 8E(b)) of the data line 24 and a semiconductor part (amorphous Si film 122 and n+amorphous Si film 123 shown in FIG. 8E(d)) of the second common main wiring 32; a pixel electrode layer forming step (fourth process) of forming the pixel electrode 22, an accessory conductor part (IZO film 141 shown in FIG. 8I(b)) of the data line 24, and an accessory conductor part (IZO film 141 shown in FIG. 8I(d)) of the second common main wiring 32, and patterning the first and second conductor parts to form the main conductor part 134 of the data line 24 and the main conductor part 131 of the second common main wiring 32; a step (fifth process) of forming the protective insulating film in the layer over the pixel electrode 22; and a step (sixth process) of forming the common electrode 30 in a layer over the protective insulating film, and forming the connecting electrode 37 integrally with the common electrode 30 in the connecting regions 18, 19. In the step of forming the protective insulating film, the first contact hole that connects the connecting electrode 37 and the first common main wiring 31 is formed in a first position (position of the contact hole 41) in the connecting unit 40, and the second contact hole that connects the connecting electrode 37 and the second common main wiring 32 is formed in a second position (position of the contact hole 42) in the connecting unit 40. In the source layer forming step, in the first position, a layer (amorphous Si film 122) in the semiconductor part of the second common main wiring 32 is formed larger than the main conductor part 131 of the second common main wiring 32. In the step of forming the protective insulating film, in the first position, the protective insulating film is formed so as to cover the semiconductor part of the second common main wiring 32. It is thereby possible to manufacture the active matrix substrate 10 which prevents the connecting electrode 37 from having the step disconnection at the pattern end of the second common main wiring 32, without increasing the number of processes.

In the step of forming the protective insulating film, in the first position, the gate insulating film and the protective insulating film are each formed in a tapered shape so as to become larger toward the lower layer side. It is thereby possible to manufacture the active matrix substrate 10 which more effectively prevents the connecting electrode 37 from having the step disconnection at the pattern end of the second common main wiring 32. The step of forming the protective insulating film includes film formation processing, photoresist formation processing, processing of etching the photoresist 153 while etching the gate insulating film and the protective insulating film with using the photoresist 153 as a mask (etching shown in FIG. 9), and photoresist peeling processing. Hence, the gate insulating film and the protective insulating film can be formed larger toward the lower layer side.

Second Embodiment

An active matrix substrate according to a second embodiment of the present invention includes a connecting unit different from that in the first embodiment. Hereinafter, a point different from the first embodiment is described, and descriptions of points in common with the first embodiment are omitted.

Figure 11:
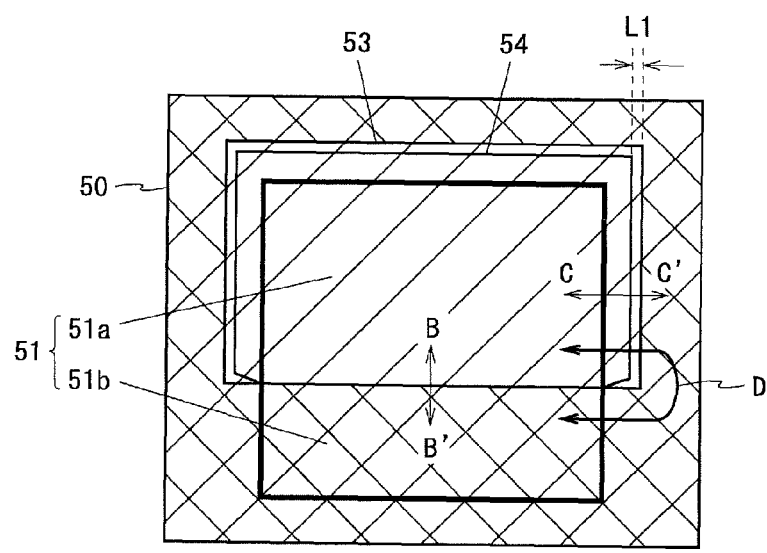
FIG. 11 is a plan view of a connecting unit of an active matrix substrate according to a second embodiment of the present invention.

FIG. 11 is a plan view of a connecting unit according to the present embodiment. A connecting unit 50 shown in FIG. 11 includes one contact hole 51 (thick line part). The contact hole 51 is obtained by integrally forming a contact hole 51a that connects a connecting electrode and a first common main wiring, and a contact hole 51b that connects the connecting electrode and a second common main wiring. The contact holes 51a, 51b correspond respectively to the contact holes 41, 42 according to the first embodiment.

As with the first embodiment, the connecting electrode and the first common main wiring (both not shown) are formed all over the connecting unit 50. An opening 53 is formed in a main conductor part (not shown) of the second common main wiring, and an opening 54 is formed in an amorphous Si film (not shown) of the second common main wiring. The connecting electrode comes into direct contact with the first common main wiring in the position of the contact hole 51a, and is electrically connected to the main conductor part of the second common main wiring via an IZO film in the position of the contact hole 51b. The amorphous Si film of the second common main wiring is formed larger than the main conductor part of the second common main wiring by the length L1 in the position of the contact hole 51.

In the connecting unit 50, the connecting electrode may have the step disconnection on a cross section B-B' shown in FIG. 11. However, the connecting unit 50 has a structure shown in FIG. 6 in a cross section C-C'. Thus, even when the connecting electrode has the step disconnection on the cross section B-B', the connecting electrode, the first common main wiring, and the second common main wiring can be electrically connected through a path D shown in FIG. 11.

The connecting unit 40 (FIG. 5) according to the first embodiment includes the two contact holes 41, 42. In contrast, the connecting unit 50 according to the present embodiment includes the one contact hole 51 obtained by integrally forming the two contact holes 51a, 51b. Thus, according to the active matrix substrate of the present embodiment, the connecting unit 50 can be reduced in size. For this reason, for example, even when the picture-frame region is narrow and the wiring in the connecting region has a complex shape, a large number of connecting units 50 can be disposed in the connecting region. Hence, the electrical connection of the common electrode, the first common main wiring, and the second common main wiring can be made reliably without increasing the connecting resistance. Further, the position of the space region where the connecting unit 50 is not disposed can be decided with high flexibility.

Third Embodiment

An active matrix substrate according to a third embodiment of the present invention includes a connecting unit different from those in the first and second embodiments. Hereinafter, a point different from the first and second embodiments is described, and descriptions of points in common with the first and second embodiments are omitted.

Figure 12:
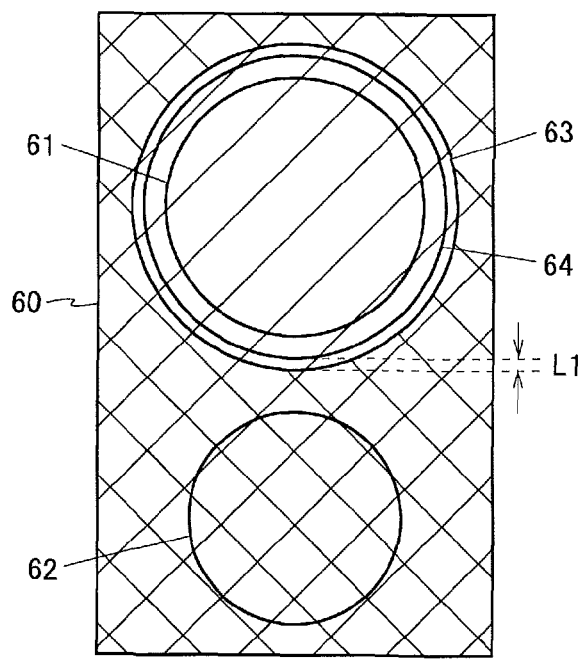
FIG. 12 is a plan view of a first example of a connecting unit of an active matrix substrate according to a third embodiment of the present invention.

FIG. 12 is a plan view of a first example of a connecting unit according to the present embodiment. A connecting unit 60 shown in FIG. 12 includes a contact hole 61 that connects a connecting electrode and a first common main wiring, and a contact hole 62 that connects the connecting electrode and a second common main wiring. The contact holes 61, 62 correspond respectively to the contact holes 41, 42 according to the first embodiment. As with the first and second embodiments, the connecting electrode and the first common main wiring (both not shown) are formed all over the connecting unit 60.

In the connecting unit 60, the contact holes 61, 62 each have a circular shape. A circular opening 63 is formed in a main conductor part (not shown) of the second common main wiring, and a circular opening 64 is formed in an amorphous Si film (not shown) of the second common main wiring. The amorphous Si film of the second common main wiring is formed larger than the main conductor part of the second common main wiring by the length L1 in the position of the contact hole 61. A radius of the opening 64 is smaller than a radius of the opening 63 by the length L1.

Figure 13:
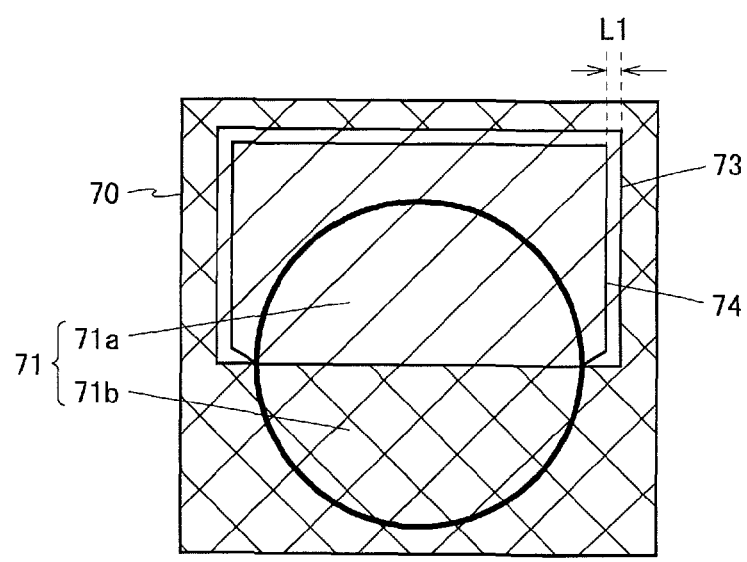
FIG. 13 is a plan view of a second example of the connecting unit of the active matrix substrate according to the third embodiment of the present invention.

FIG. 13 is a plan view of a second example of the connecting unit according to the present embodiment. A connecting unit 70 shown in FIG. 13 includes one contact hole 71 (thick line part). The contact hole 71 is obtained by integrally forming a contact hole 71a that connects a connecting electrode and a first common main wiring, and a contact hole 71b that connects the connecting electrode and a second common main wiring. The contact holes 71a, 71b correspond respectively to the contact holes 41, 42 according to the first embodiment.

In the connecting unit 70, the contact hole 71 has a circular shape. A rectangular opening 73 is formed in a main conductor part (not shown) of the second common main wiring, and a rectangular opening 74 is formed in an amorphous Si film (not shown) of the second common main wiring. The amorphous Si film of the second common main wiring is formed larger than the main conductor part of the second common main wiring by the length L1 in the position of the contact hole 71. Each side (except for a side partially existing in the contact hole 71) of the opening 74 is shorter than each corresponding side of the opening 73 by a length (2×L1).

As shown in FIG. 12, the shape of the two contact holes formed in the connecting unit is not restricted to be rectangular, but may be circular. Besides, the shape of the two contact holes may be polygonal other than being rectangular, or may be elliptical. The shapes of the two contact holes may be different. As thus described, the shape of at least one of the two contact holes may be either rectangular or polygonal other than being rectangular, or may be either circular or elliptical.

As shown in FIG. 13, the shape of the contact hole formed integrally in the connecting unit is not restricted to be rectangular, but may be circular. Further, the shape of the contact hole integrally formed may be polygonal other than being rectangular, or may be elliptical. As thus described, the shape of the contact hole integrally formed is either rectangular or polygonal other than being rectangular, or may be either circular or elliptical.

The shape of the opening formed in the main conductor part and the amorphous Si film of the second common main wiring is not restricted to be rectangular, but may be polygonal other than being rectangular, circular, or elliptical. The shapes of the contact hole and the opening may be decided in a freely selectable manner in accordance with a variety of design conditions (e.g., the shape of the wiring in the connecting region, the shape and size of the columnar spacer, etc.).

When alignment processing of an alignment film is to be performed by rubbing, the shape of the contact hole preferably has no vertex so as to reduce streaky unevenness caused by rubbing. The use of a circular or elliptical contact hole can reduce display unevenness caused by rubbing.

As shown above, when two contact holes are formed separately in the connecting unit, the shape of at least one of the two contact holes may be either rectangular or polygonal other than being rectangular, or may be either circular or elliptical. Further, when two contact holes are formed integrally in the connecting unit, the shape of the contact hole integrally formed may be either rectangular or polygonal other than being rectangular, or may be either circular or elliptical. Even with the use of the contact hole having any shape, it is possible to constitute a connecting unit for connecting the common electrode, the first common main wiring, and the second common main wiring. Especially with the use of the contact hole in the shape without a vertex (circular or elliptical), it is possible to reduce display unevenness caused by rubbing.

INDUSTRIAL APPLICABILITY

The active matrix substrate of the present invention has the feature of being able to prevent the connecting electrode from having a step disconnection at the pattern end of the common main wiring, and can thus be used for a liquid crystal panel and the like. The liquid crystal panel of the present invention can be used for a liquid crystal display device, display units of a variety of electric devices, and the like.

DESCRIPTION OF REFERENCE CHARACTERS

1: LIQUID CRYSTAL DISPLAY DEVICE
2: LIQUID CRYSTAL PANEL
3: DISPLAY CONTROL CIRCUIT
4: GATE LINE DRIVE CIRCUIT
5: DATA LINE DRIVE CIRCUIT
6: BACKLIGHT
7: COUNTER SUBSTRATE
10: ACTIVE MATRIX SUBSTRATE
18, 19: CONNECTING REGION
20: PIXEL CIRCUIT
21: TFT
22: PIXEL ELECTRODE
23: GATE LINE
24: DATA LINE
30: COMMON ELECTRODE
31: FIRST COMMON MAIN WIRING
32: SECOND COMMON MAIN WIRING
36: SLIT
37: CONNECTING ELECTRODE
40, 50, 60, 70: CONNECTING UNIT
41, 42, 51, 61, 62, 71: CONTACT HOLE
43, 44, 53, 54, 63, 64, 73, 74: OPENING
49: SPACE REGION
121, 151, 152: SiNx FILM
122: AMORPHOUS Si FILM
123: n+AMORPHOUS Si FILM
131, 134: MAIN CONDUCTOR PART
141: IZO FILM

The invention claimed is:
1. An active matrix substrate, comprising:
a plurality of gate lines formed in a first wiring layer;
a plurality of data lines, each of which is a laminated wiring formed in a semiconductor layer, a second wiring layer, and a pixel electrode layer;
a plurality of pixel circuits arranged corresponding to intersections of the gate lines and the data lines and each including a switching element and a pixel electrode;
a protective insulating film formed in a layer over the gate line, the data line, the switching element, and the pixel electrode;
a common electrode formed in a layer over the protective insulating film;
a first common main wiring formed in the first wiring layer and having a portion formed in a connecting region;
a second common main wiring which is a laminated wiring formed in the semiconductor layer, the second wiring layer, and the pixel electrode layer, and has a portion formed in the connecting region;
a connecting electrode formed integrally with the common electrode in the connecting region; and
a plurality of connecting units arranged in the connecting region and each including a first contact hole that connects the connecting electrode and the first common main wiring, and a second contact hole that connects the connecting electrode and the second common main wiring, wherein
a portion of the second common main wiring which is formed in a layer in the semiconductor layer is formed, in a position of the first contact hole, larger than a portion of the second common main wiring which is formed in the second wiring layer, and is covered with the protective insulating film.

2. The active matrix substrate according to claim 1, further comprising a gate insulating film between the first wiring layer and the semiconductor layer, wherein
in the position of the first contact hole, the gate insulating film and the protective insulating film are each formed in a tapered shape so as to become larger toward a lower layer side.

3. The active matrix substrate according to claim 1, wherein the first contact hole and the second contact hole are formed separately in the connecting unit.

4. The active matrix substrate according to claim 3, wherein at least one of shapes of the first contact hole and the second contact hole is either rectangular or polygonal other than being rectangular.

5. The active matrix substrate according to claim 3, wherein at least one of shapes of the first contact hole and the second contact hole is either circular or elliptical.

6. The active matrix substrate according to claim 1, wherein the first contact hole and the second contact hole are formed integrally in the connecting unit.

7. The active matrix substrate according to claim 6, wherein a shape of a contact hole integrally formed is either rectangular or polygonal other than being rectangular.

8. The active matrix substrate according to claim 6, wherein a shape of a contact hole integrally formed is either circular or elliptical.

9. The active matrix substrate according to claim 1, wherein the connecting units are disposed two-dimensionally while forming a space region in the connecting region.

10. A liquid crystal panel, comprising:
an active matrix substrate; and
a counter substrate disposed so as to face the active matrix substrate, wherein
the active matrix substrate includes:

a plurality of gate lines formed in a first wiring layer;

a plurality of data lines, each of which is a laminated wiring formed in a semiconductor layer, a second wiring layer, and a pixel electrode layer;

a plurality of pixel circuits arranged corresponding to intersections of the gate lines and the data lines and each including a switching element and a pixel electrode;

a protective insulating film formed in a layer over the gate line, the data line, the switching element, and the pixel electrode;

a common electrode formed in a layer over the protective insulating film;

a first common main wiring formed in the first wiring layer and having a portion formed in a connecting region;

a second common main wiring which is a laminated wiring formed in the semiconductor layer, the second wiring layer, and the pixel electrode layer, and has a portion formed in the connecting region;

a connecting electrode formed integrally with the common electrode in the connecting region; and a plurality of connecting units arranged in the connecting region and each including a first contact hole that connects the connecting electrode and the first common main wiring, and a second contact hole that connects the connecting electrode and the second common main wiring, a portion of the second common main wiring which is formed in a layer in the semiconductor layer is formed, in a position of the first contact hole, larger than a portion of the second common main wiring which is formed in the second wiring layer, and is covered with the protective insulating film, the connecting units are disposed two-dimensionally while forming a space region in the connecting region, and the counter substrate has a columnar spacer in a position facing the space region.

11. A method for manufacturing an active matrix substrate including a plurality of connecting units in a connecting region, the method comprising:

a step of forming, in a first wiring layer, a plurality of gate lines and a first common main wiring having a portion formed in the connecting region;

a step of forming a gate insulating film and a semiconductor film;

a source layer forming step of forming, in a second wiring layer, a first conductor part to be a base of a main conductor part of a plurality of data lines, and a second conductor part to be a base of a main conductor part of a second common main wiring having a portion formed in the connecting region, and patterning the semiconductor film to form a semiconductor part of the data line and a semiconductor part of the second common main wiring;

a pixel electrode layer forming step of forming a pixel electrode, an accessory conductor part of the data line, and an accessory conductor part of the second common main wiring, and patterning the first and second conductor parts to form a main conductor part of the data line and a main conductor part of the second common main wiring;

a step of forming a protective insulating film in a layer over the pixel electrode, and a step of forming a common electrode in a layer over the protective insulating film, and forming a connecting electrode integrally with the common electrode in the connecting region, wherein in the step of forming the protective insulating film, a first contact hole that connects the connecting electrode and the first common main wiring is formed in a first position in the connecting unit, and a second contact hole that connects the connecting electrode and the second common main wiring is formed in a second position in the connecting unit, in the source layer forming step, in the first position, a layer in the semiconductor layer of the second common main wiring is formed larger than the main conductor part of the second common main wiring, and in the step of forming the protective insulating film, in the first position, the protective insulating film is formed so as to cover the semiconductor part of the second common main wiring.

12. The method for manufacturing an active matrix substrate according to claim 11, wherein in the step of forming the protective insulating film, in the first position, the gate insulating film and the protective insulating film are each formed in a tapered shape so as to become larger toward a lower layer side.

13. The method for manufacturing an active matrix substrate according to claim 12, wherein the step of forming the protective insulating film includes film formation processing, photoresist formation processing, processing of etching a photoresist while etching the gate insulating film and the protective insulating film with using the photoresist as a mask, and photoresist peeling processing.

* * * * *